US012738322B2

(12) United States Patent
Mahmoodi et al.

(10) Patent No.: US 12,738,322 B2
(45) Date of Patent: Sep. 15, 2026

(54) APPARATUS AND METHODS FOR MODIFYING IMPEDANCES IN TIME-BASED VECTOR-MATRIX MULTIPLICATION CIRCUITS

(71) Applicant: Sandisk Technologies, Inc., Milpitas, CA (US)

(72) Inventors: Mohammad Mahmoodi, Santa Barbara, CA (US); Zahra Fahimi, Santa Barbara, CA (US); Martin Lueker-Boden, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 56 days.

(21) Appl. No.: 18/897,326

(22) Filed: Sep. 26, 2024

(65) Prior Publication Data

US 2026/0088093 A1 Mar. 26, 2026

(51) Int. Cl.
*G11C 16/10* (2006.01)
*G11C 5/06* (2006.01)
*G11C 16/24* (2006.01)

(52) U.S. Cl.
CPC ............ *G11C 16/102* (2013.01); *G11C 5/063* (2013.01); *G11C 16/24* (2013.01)

(58) Field of Classification Search
CPC ........ G11C 16/102; G11C 5/063; G11C 16/24
USPC .................................................. 365/189.011
See application file for complete search history.

(56) References Cited

U.S. PATENT DOCUMENTS 6,307,791 B1 * 10/2001 Otsuka ................. G11C 7/1057 365/189.11
7,126,853 B2 10/2006 Kim
7,751,251 B2 7/2010 Bauer
10,411,704 B1 * 9/2019 Lin .................... H03K 19/0005
10,635,398 B2 4/2020 Lin et al.
11,354,562 B2 6/2022 Tran et al.
2005/0002223 A1 * 1/2005 Coteus ................. G11C 29/022 365/154
2021/0019609 A1 1/2021 Strukov et al.
2023/0282288 A1 * 9/2023 Yang ...................... G11C 16/26 365/185.21
2024/0313776 A1 * 9/2024 Watanabe .......... H03K 19/0005
2024/0379136 A1 * 11/2024 Yeh ........................ G11C 5/025

FOREIGN PATENT DOCUMENTS

CN 114464240 A * 5/2022 ............ G11C 16/30

OTHER PUBLICATIONS

Mohammad Bavandpour et al., "3D-aCortex: an ultra-compact energy-efficient neurocomputing platform based on commercial 3D-NAND flash memories", Neuromorphic Computer Engineering, Jul. 15, 2021.

* cited by examiner

*Primary Examiner* — Fernando Hidalgo
(74) *Attorney, Agent, or Firm* — PEARL COHEN LLP

(57) ABSTRACT

An apparatus is provided that includes a memory array including non-volatile memory cells configured to store weights of an artificial neural network, a bit line coupled to a plurality of the non-volatile memory cells, and an interface circuit coupled to the bit line, the interface circuit configured to amplify an output impedance of the memory array.

20 Claims, 25 Drawing Sheets

$$\begin{bmatrix} y_1 \\ y_2 \\ y_3 \\ \vdots \\ y_n \end{bmatrix} = \begin{bmatrix} x_1 & x_2 & x_3 & \cdots & x_m \end{bmatrix} \times \begin{bmatrix} w_{11} & w_{12} & w_{13} & \cdots & w_{1n} \\ w_{21} & w_{22} & w_{23} & \cdots & w_{2n} \\ w_{31} & w_{32} & w_{33} & \cdots & w_{3n} \\ \vdots & \vdots & \vdots & \cdots & \vdots \\ w_{m1} & w_{m2} & w_{m3} & \cdots & w_{mn} \end{bmatrix}$$

1008
Sense Amplifier
1000n
Impedance Translator Circuit
1002n
Sense Amplifier
1000₁
Impedance Translator Circuit
1002₁
Controller 920
Input Neuron 918
WORD LINE DRIVER 914
902

APPARATUS AND METHODS FOR MODIFYING IMPEDANCES IN TIME-BASED VECTOR-MATRIX MULTIPLICATION CIRCUITS

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may be non-volatile memory or volatile memory. A non-volatile memory allows information to be stored and retained even when the non-volatile memory is not connected to a source of power (e.g., a battery).

Non-volatile memory devices include one or more memory chips having multiple arrays of memory cells. The memory arrays may have associated decoders and circuits for performing read, write, and erase operations. Memory cells within the arrays may be arranged in horizontal rows and vertical columns. Each row may be addressed by a word line, and each column may be addressed by a bit line. Data may be loaded into columns of the array using a series of data busses. Each column may hold a predefined unit of data, for instance, a word encompassing two bytes of information.

BRIEF DESCRIPTION OF THE DRAWINGS

Like-numbered elements refer to common components in the different figures.

DETAILED DESCRIPTION

The multiplication of vectors and matrices, known as vector-matrix multiplication (VMM), is a fundamental operation in various algorithms used for signal and data processing. In particular, the most frequent operation in deep learning e.g., convolutional neural networks or large language models is VMM. Energy efficient and high-speed implementation of VMM operation is the key to design efficient deep learning systems.

Non-volatile memory arrays, such as 3D NAND memory arrays, may be used to implement VMM, and may offer higher energy efficiency compared to their digital counterparts when operating at low-to-medium computing precision. One of the main challenges that limits the computing precision in 3D NAND-based VMMs is the bit line voltage.

In particular, when using the most energy efficient and compact passive output sensing circuit topology, the bit line voltage is changed during the computation. However, the change in the bit line voltage impacts the cell currents and directly causes distortion and precision reduction in the circuit. Because the impact is input dependent, compensation techniques are not viable. One design methodology is the limit the bit line voltage swing by increasing the size of capacitors or reducing the integration time. However, the former will lead to large area and the latter will reduce the signal-to-noise ratio (SNR) of the circuit.

Technology is described to modify impedance matching conditions at the array-to-neuron interface. In an embodiment, an interface circuit increases the DC impedance seen from the array side. In another embodiment, sense circuitry is modified to attenuate the DC impedance of sensing circuits.

Without wanting to be bound by any particular theory, it is believed that the described technology may reduce capacitor size by about 5×, and may enable a reduction in capacitor area by about 2× at the same computing accuracy.

Figure 1:
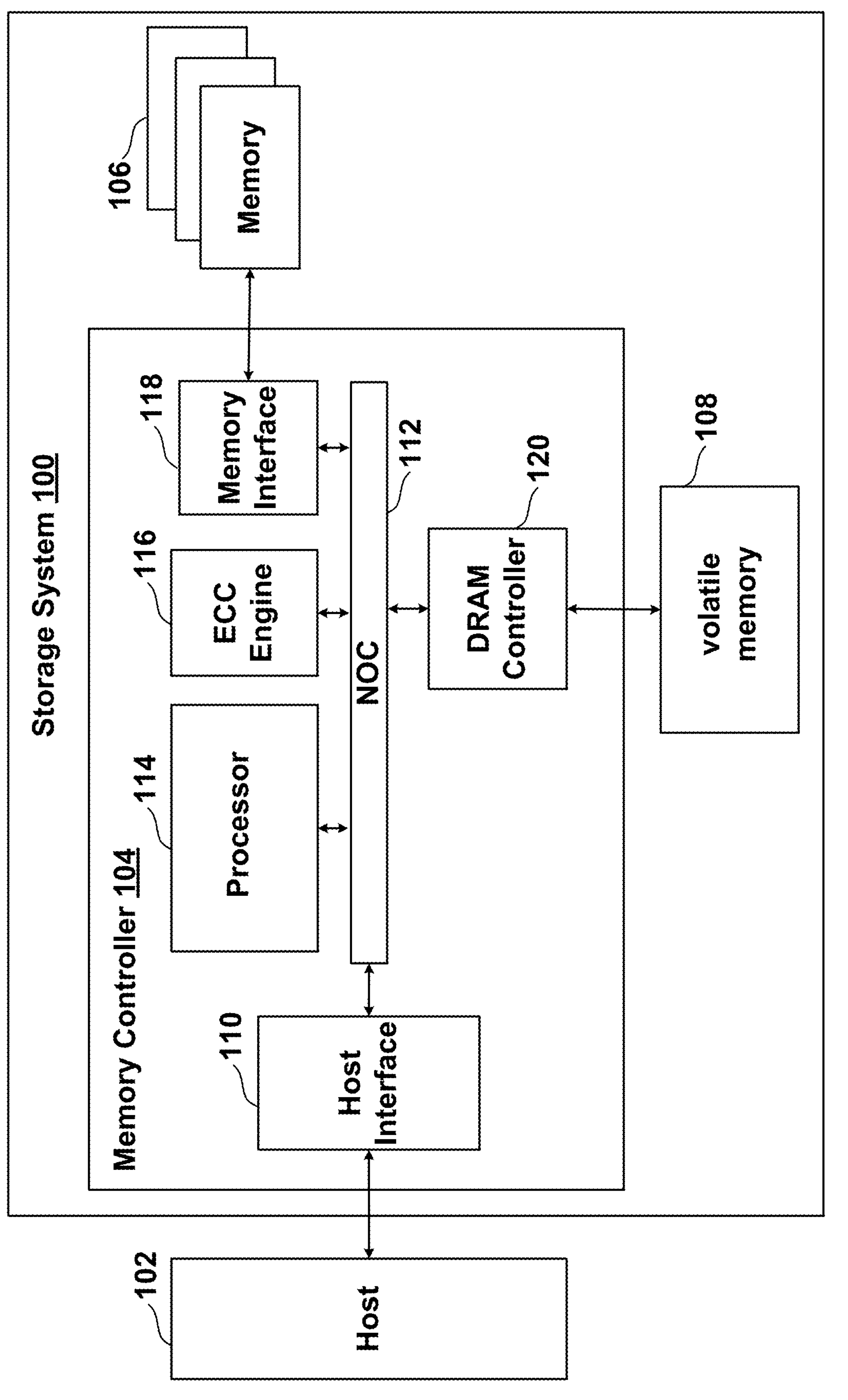
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 also can be a memory card, USB drive or other type of storage system. The proposed technology is not limited to any one type of memory system.

Storage system 100 is connected to a host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 104 connected to non-volatile memory 106 and local high speed volatile memory 108 (e.g., DRAM). Local high speed volatile memory 108 is used by memory controller 104 to perform certain functions. For example, local high speed volatile memory 108 stores logical to physical address translation tables ("L2P tables").

Memory controller 104 includes a host interface 110 that is connected to and in communication with host 102. In one embodiment, host interface 110 implements a NVM Express (NVMe) over PCI Express (PCIe). Other interfaces can also be used, such as SCSI, SATA, etc. Host interface 110 also is connected to a network-on-chip (NOC) 112.

A NOC is a communication subsystem on an integrated circuit. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs.

The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 112 can be replaced by a bus.

Connected to and in communication with NOC 112 is a processor 114, an ECC engine 116, a memory interface 118, and a DRAM controller 120. DRAM controller 120 is used to operate and communicate with local high speed volatile memory 108 (e.g., DRAM). In other embodiments, local high speed volatile memory 108 can be SRAM or another type of volatile memory.

Processor 114 performs the various controller memory operations, such as programming, erasing, reading, and memory management processes. In one embodiment, processor 114 is programmed by firmware. In other embodiments, processor 114 is a custom and dedicated hardware circuit without any software. Processor 114 also implements a translation module, as a software/firmware process or as a dedicated hardware circuit.

In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 104 (e.g., the translation module) performs address translation between the logical addresses used by the host and the physical addresses used by the memory die.

One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables.

Instead, the logical address to physical address tables (or L2P tables) can be any type of data structure. In some examples, the memory space of a storage system is so large that the local memory 108 cannot hold all of the L2P tables. In such a case, the entire set of L2P tables are stored in non-volatile memory 106 and a subset of the L2P tables are cached (L2P cache) in the local high speed volatile memory 108.

ECC engine 116 performs error correction services. For example, ECC engine 116 performs data encoding and decoding, as per the implemented ECC technique. In one embodiment, ECC engine 116 is an electrical circuit programmed by software. For example, ECC engine 116 can be a processor that can be programmed. In other embodiments, ECC engine 116 is a custom and dedicated hardware circuit without any software. In another embodiment, the function of ECC engine 116 is implemented by processor 114.

Memory interface 118 communicates with non-volatile memory 106. In one embodiment, memory interface 118 provides a Toggle Mode interface. In another embodiment, memory interface 118 provides a double data rate (DDR) interface. Other interfaces also can be used. In some example implementations, memory interface 118 (or another portion of controller 104) implements a scheduler and buffer for transmitting data to and receiving data from one or more memory die.

Figure 2A:
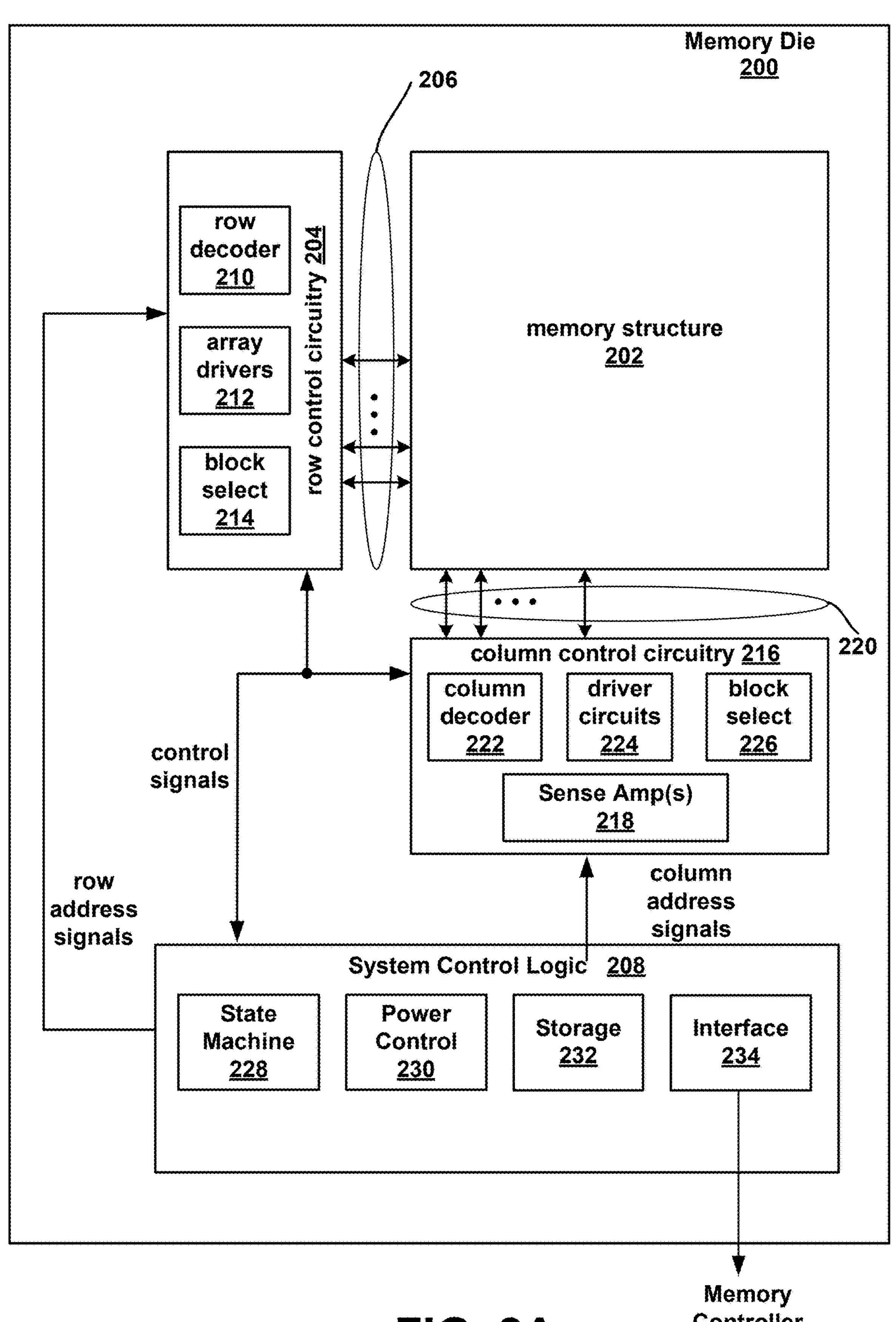
FIG. 2A is a block diagram of one embodiment of a memory die.

In one embodiment, non-volatile memory 106 includes one or more memory die. FIG. 2A is a functional block diagrams of an embodiment of a memory die 200 that includes non-volatile memory 106. Each of the one or more memory die of non-volatile memory 106 can be implemented as memory die 200 of FIG. 2A. The components depicted in FIG. 2A are electrical circuits.

Memory die 200 includes a memory structure 202 that can include non-volatile memory cells, as described in more detail below. The array terminal lines of memory structure 202 include the various layer(s) of word lines organized as rows, and the various layer(s) of bit lines organized as columns. However, other orientations can also be implemented.

Memory die 200 includes row control circuitry 204, whose outputs 206 are connected to respective word lines of the memory structure 202. Row control circuitry 204 receives a group of M row address signals and one or more various control signals from system control logic circuit 208, and typically may include such circuits as row decoders 210, array terminal drivers 212, and block select circuitry 214 for both reading and writing (programming) operations.

Row control circuitry 204 also may include read/write circuitry. Memory die 200 also includes column control circuitry 216 including sense amplifier(s) 218 whose input/outputs 220 are connected to respective bit lines of memory structure 202. Although only a single block is shown for memory structure 202, a memory die can include multiple arrays that can be individually accessed.

Column control circuitry 216 receives a group of N column address signals and one or more various control signals from system control logic 208, and typically may include such circuits as column decoders 222, array terminal receivers or driver circuits 224, block select circuitry 226, as well as read/write circuitry, and I/O multiplexers.

System control logic 208 receives data and commands from memory controller 104 (FIG. 1) and provides output data and status to host 102. In some embodiments, system control logic 208 (which includes one or more electrical circuits) includes a state machine 228 that provides die-level control of memory operations.

In one embodiment, state machine 228 is programmable by software. In other embodiments, state machine 228 does not use software and is completely implemented in hardware (e.g., electrical circuits). In another embodiment, state machine 228 is replaced by a micro-controller or microprocessor, either on or off the memory chip.

System control logic 208 also can include a power control module 230 that controls the power and voltages supplied to the rows and columns of memory structure 202 during memory operations and may include charge pumps and regulator circuit for creating regulating voltages. System control logic 208 includes storage 232 (e.g., RAM, registers, latches, etc.), which may be used to store parameters for operating memory structure 202.

Commands and data are transferred between memory controller 104 and memory die 200 via memory controller interface 234 (also referred to as a "communication interface"). Memory controller interface 234 is an electrical interface for communicating with memory controller 104. Examples of memory controller interface 234 include a Toggle Mode Interface, a DDR interface and an Open NAND Flash Interface (ONFI). Other I/O interfaces can also be used. In a DDR clock scheme, rising edges and falling edges of a clock signal are sampling transitions.

In some embodiments, all elements of memory die 200, including the system control logic 208, can be formed as part of a single die. In other embodiments, some or all of the system control logic 208 can be formed on a different die.

In an embodiment, memory structure 202 is a three-dimensional memory array of non-volatile memory cells in which multiple memory levels are formed above a single substrate, such as a wafer. Memory structure 202 may include any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 includes a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein.

Other examples of suitable technologies for memory cells of memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell.

A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells.

In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light.

In other PCM embodiments, the memory cells are programmed by current pulses. Note that the use of "pulse" in this document does not require a square pulse but includes a (continuous or non-continuous) vibration or burst of sound, current, voltage light, or another wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to memory structure 202. However, this reduces the area of the memory die available for the peripheral circuitry. This can place quite severe restrictions on these elements of the peripheral circuitry.

For example, the need to fit sense amplifier circuits within the available area can be a significant restriction on sense amplifier design architectures. With respect to system control logic 208, reduced availability of area can limit the available functions that can be implemented on-chip. Consequently, a basic trade-off in the design of a memory die for the storage system 100 is the amount of area to devote to memory structure 202 and the amount of area to devote to the peripheral circuitry.

Another area in which memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based.

For example, elements such sense amplifier circuits, charge pumps, logic elements in a state machine, and other peripheral circuitry in system control logic 208 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed die that are then bonded together. More specifically, memory structure 202 can be formed on one die (referred to as the memory die) and some or all of the peripheral circuitry elements, including one or more control circuits, can be formed on a separate die (referred to as the control die).

For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology.

For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array.

The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
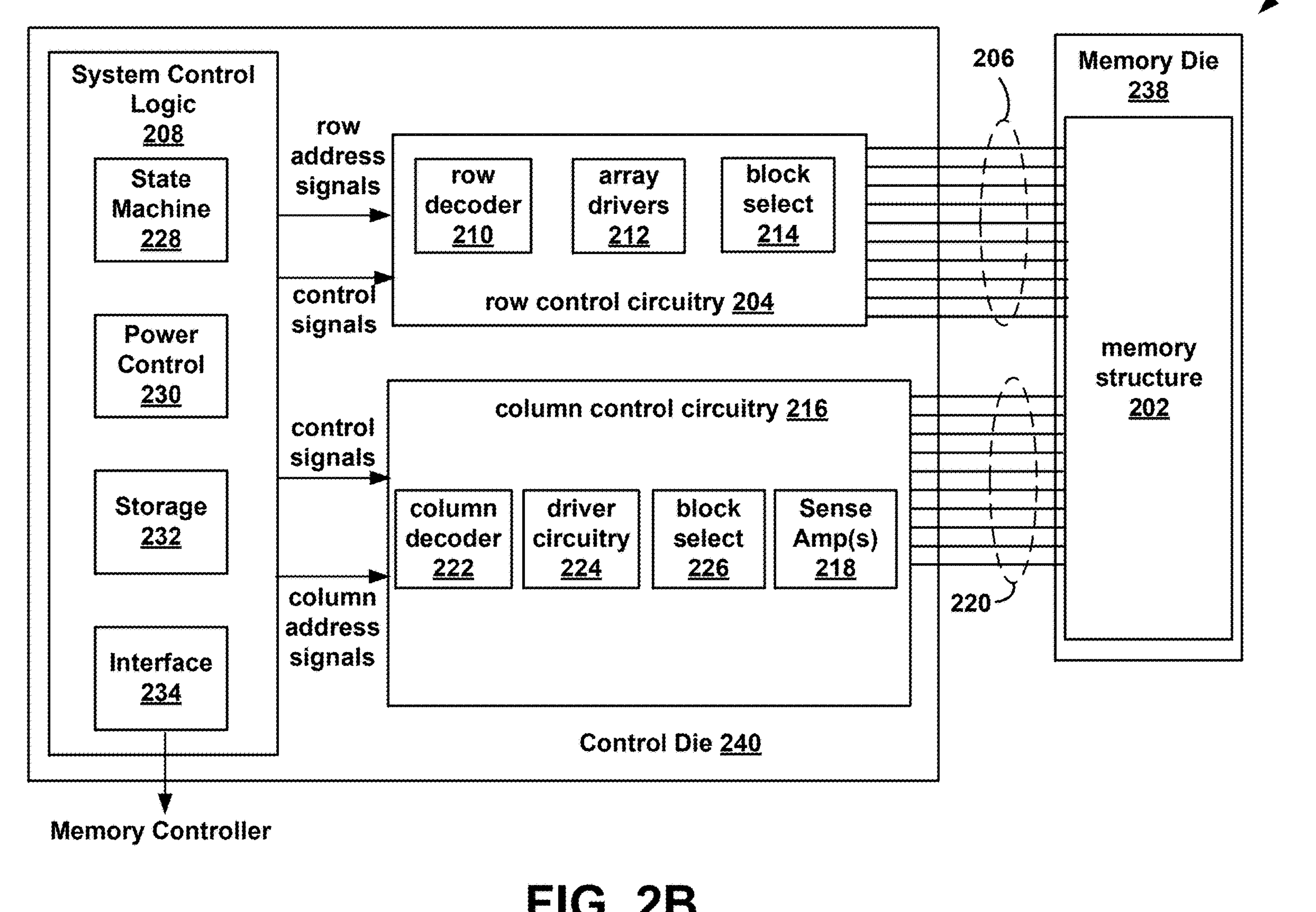
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 236. One or more integrated memory assemblies 236 may be used to implement the non-volatile memory 106 of storage system 100.

Integrated memory assembly 236 includes two types of semiconductor die (or more succinctly, "die"). Memory die 238 includes memory structure 202. Memory structure 202 includes non-volatile memory cells. Control die 240 includes control circuitry 208, 216, and 204 (as described above). In some embodiments, control die 240 is configured to connect to memory structure 202 in memory die 238. In some embodiments, memory die 238 and control die 240 are bonded together.

FIG. 2B shows an example of the peripheral circuitry, including control circuits, formed in a peripheral circuit or control die 240 coupled to memory structure 202 formed in memory die 238. Common components are labelled similarly to FIG. 2A. System control logic 208, row control circuitry 204, and column control circuitry 216 are located in control die 240. In some embodiments, all or a portion of column control circuitry 216 and all or a portion of row control circuitry 204 are located on memory die 238. In some embodiments, some of the circuitry in system control logic 208 is located on memory die 238.

System control logic 208, row control circuitry 204, and column control circuitry 216 may be formed by a common process (e.g., CMOS process), so that adding elements and functions, such as ECC, more typically found on a memory controller 104 may require few or no additional process steps (i.e., the same process steps used to fabricate memory controller 104 may also be used to fabricate system control logic 208, row control circuitry 204, and column control circuitry 216).

Thus, while moving such circuits from a die such as memory die 238 may reduce the number of steps needed to fabricate such a die, adding such circuits to a die such as control die 240 may not require many additional process steps. Control die 240 also could be referred to as a CMOS die, due to the use of CMOS technology to implement some or all of control circuitry 204, 208, 216.

FIG. 2B shows column control circuitry 216 including sense amplifier(s) 218 on control die 240 coupled to memory structure 202 on memory die 238 through electrical paths 220. For example, electrical paths 220 may provide electrical connection between column decoder 222, driver circuitry 224, and block select 226 and bit lines of memory structure 202.

Electrical paths 220 may extend from column control circuitry 216 in control die 240 through pads on control die 240 that are bonded to corresponding pads of the memory die 238, which are connected to bit lines of memory structure 202. Each bit line of memory structure 202 may have a corresponding electrical path in electrical paths 220, including a pair of bond pads, which connects to column control circuitry 216.

Similarly, row control circuitry 204, including row decoder 210, array drivers 212, and block select 214 are coupled to memory structure 202 through electrical paths 206. Each of electrical path 206 may correspond to a word line, dummy word line, or select gate line. Additional electrical paths may also be provided between control die 240 and memory die 238.

For purposes of this document, the phrases "a control circuit" or "one or more control circuits" can include any one of or any combination of memory controller 104, state machine 228, all or a portion of system control logic 208, all or a portion of row control circuitry 204, all or a portion of column control circuitry 216, a microcontroller, a microprocessor, and/or other similar functioned circuits.

The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

In some embodiments, there is more than one control die 240 and more than one memory die 238 in an integrated memory assembly 236. In some embodiments, the integrated memory assembly 236 includes a stack of multiple control die 240 and multiple memory die 238.

Figure 3A:
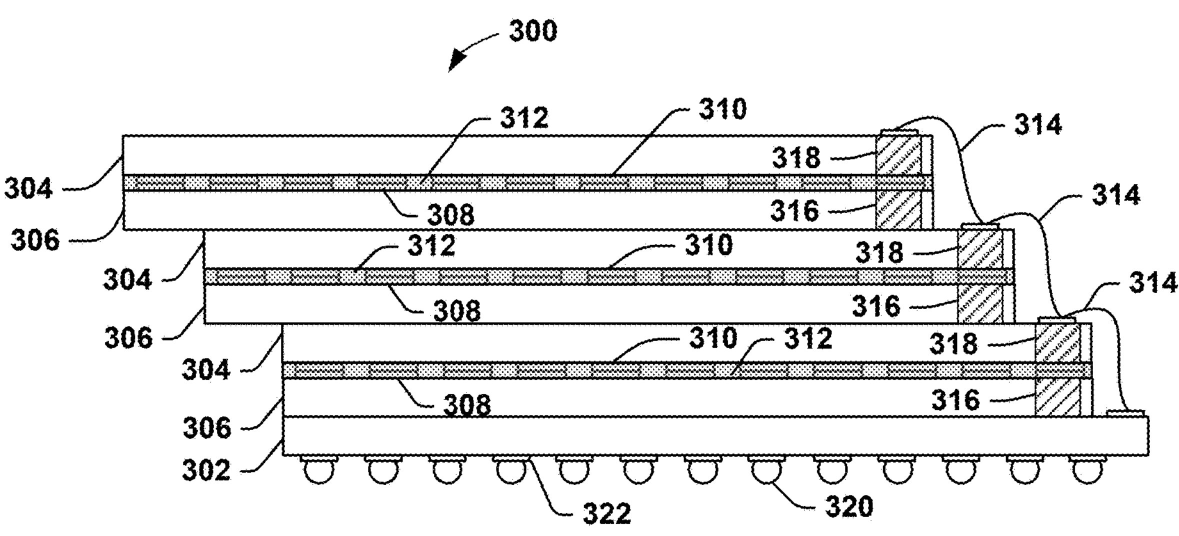
FIGS. 3A and 3B depict different embodiments of integrated memory assemblies.

FIG. 3A depicts a side view of an embodiment of an integrated memory assembly 300 stacked on a substrate 302 (e.g., a stack including control die 304 and memory die 306). The integrated memory assembly 300 has three control die 304 and three memory die 306. In some embodiments, there are more than three memory die 306 and more than three control die 304.

Each control die 304 is affixed (e.g., bonded) to at least one memory die 306. Some of the bond pads 308/310 are depicted, although there may be many more bond pads. A space between two die 306, 304 that are bonded together is filled with a solid layer 312, which may be formed from epoxy or other resin or polymer. This solid layer 312 protects the electrical connections between the die 306, 304, and further secures the die together. Various materials may be used as solid layer 312, but in embodiments, it may be Hysol epoxy resin from Henkel Corp., having offices in California, USA.

Integrated memory assembly 300 may for example be stacked with a stepped offset, leaving the bond pads at each level uncovered and accessible from above. Wire bonds 314 connected to the bond pads connect control die 304 to substrate 302. A number of such wire bonds may be formed across the width of each control die 304 (i.e., into the page of FIG. 3A).

A memory die through silicon via (TSV) 316 may be used to route signals through each memory die 306. A control die TSV 318 may be used to route signals through each control die 304. The TSVs 316, 318 may be formed before, during or after formation of the integrated circuits in semiconductor die 306, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 320 optionally may be affixed to contact pads 322 on a lower surface of substrate 302. Solder balls 320 may be used to couple integrated memory assembly 300 electrically and mechanically to a host device such as a printed circuit board. Solder balls 320 may be omitted where the integrated memory assembly 300 is to be used as an LGA package. Solder balls 320 may form a part of an interface between integrated memory assembly 300 and memory controller 104 (FIG. 1).

Figure 3B:
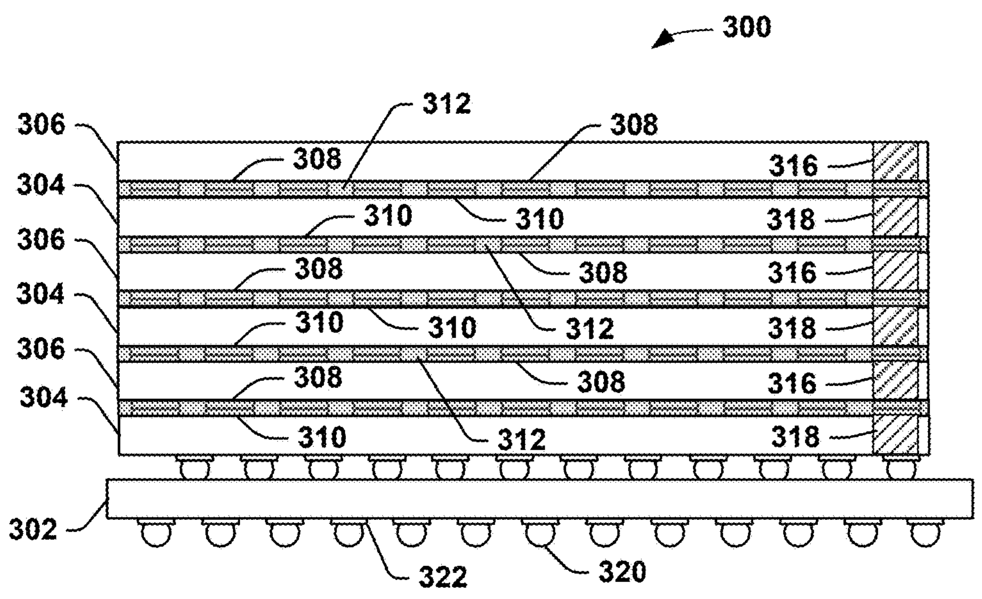

FIG. 3B depicts a side view of another embodiment of an integrated memory assembly 300 stacked on a substrate 302. The integrated memory assembly 300 of FIG. 3B has three control die 304 and three memory die 306. In some embodiments, there are many more than three memory die 306 and many more than three control die 304. In this example, each control die 304 is bonded to at least one memory die 306. Optionally, a control die 304 may be bonded to two or more memory die 306.

Some of the bond pads 308, 310 are depicted. There may be many more bond pads. A space between two die 306, 304 that are bonded together is filled with a solid layer 312, which may be formed from epoxy or other resin or polymer. In contrast to the example in FIG. 3A, integrated memory assembly 300 of FIG. 3B does not have a stepped offset. A memory die TSV 316 may be used to route signals through each memory die 306. A control die TSV 318 may be used to route signals through each control die 304.

As has been briefly discussed above, control die 304 and memory die 306 may be bonded together. Bond pads on each control die 304 and each memory die 306 may be used to bond the two die together. In some embodiments, the bond pads are bonded directly to each other, without solder or other added material, in a so-called Cu-to-Cu bonding process.

In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension.

Such bonds may be formed at room temperature, though heat also may be applied. In embodiments using cu-to-cu bonding, the bond pads may be about 5 μm square and spaced from each other with a pitch of 5 μm to 5 μm. Although this process is referred to herein as cu-to-cu bonding, this term also may apply even where the bond pads are formed of materials other than copper.

When the area of bond pads is small, it may be difficult to bond the semiconductor die together. The size of and pitch between bond pads may be further reduced by providing a film layer on the surfaces of the semiconductor die including the bond pads. The film layer is provided around the bond pads. When the die are brought together, the bond pads may bond to each other, and the film layers on the respective die may bond to each other.

Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller (or greater) sizes and pitches.

Some embodiments may include a film on surface of control die 304 and memory die 306. Where no such film is initially provided, a space between the die may be under filled with an epoxy or other resin or polymer. The under-fill material may be applied as a liquid which then hardens into a solid layer. This under-fill step protects the electrical connections between control die 304 and memory die 306, and further secures the die together. Various materials may be used as under-fill material, such as Hysol epoxy resin from Henkel Corp., having offices in California, USA.

Figure 4A:
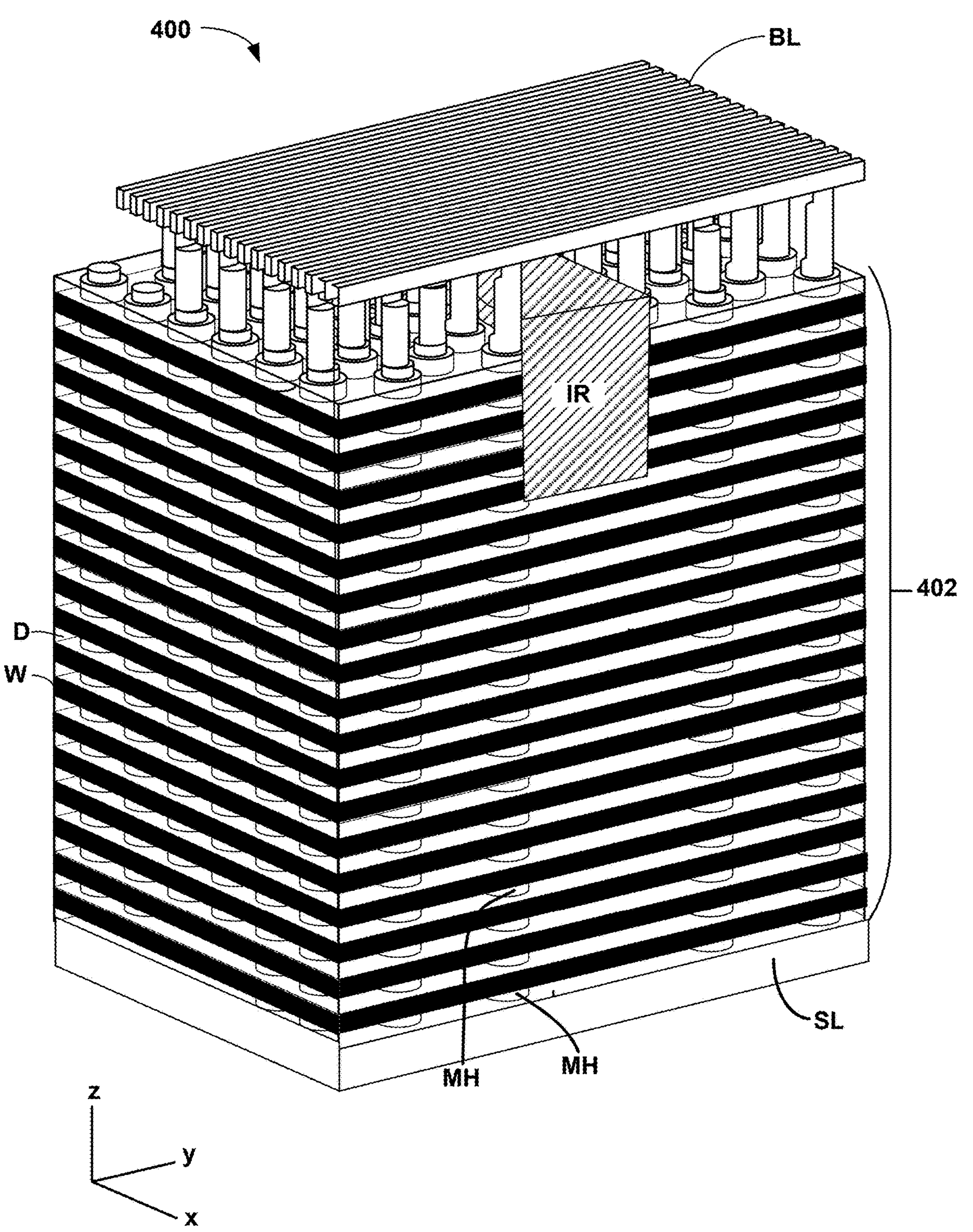
FIG. 4A is a perspective view of a portion of one embodiment of a monolithic three dimensional memory structure.

FIG. 4A is a perspective view of a portion of one example embodiment of a monolithic three dimensional memory array included in memory structure 202, which includes a plurality non-volatile memory cells arranged as vertical NAND strings. For example, FIG. 4A shows a portion 400 of one block of memory.

The structure depicted includes a set of bit lines BL positioned above a stack 402 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements.

As will be explained below, in one embodiment the alternating dielectric layers and conductive layers are divided into four or five (or a different number of) regions by isolation regions IR. FIG. 4A shows one isolation region IR separating two regions. Below the alternating dielectric layers and word line layers is a source line layer SL. Memory holes are formed in the stack of alternating dielectric layers and conductive layers.

For example, one of the memory holes is marked as MH. Note that in FIG. 4A, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells.

Each memory cell can store one or more bits of data. Thus, the non-volatile memory cells are arranged in memory holes. More details of the three dimensional monolithic memory array that includes memory structure 202 is provided below.

Figure 4B:
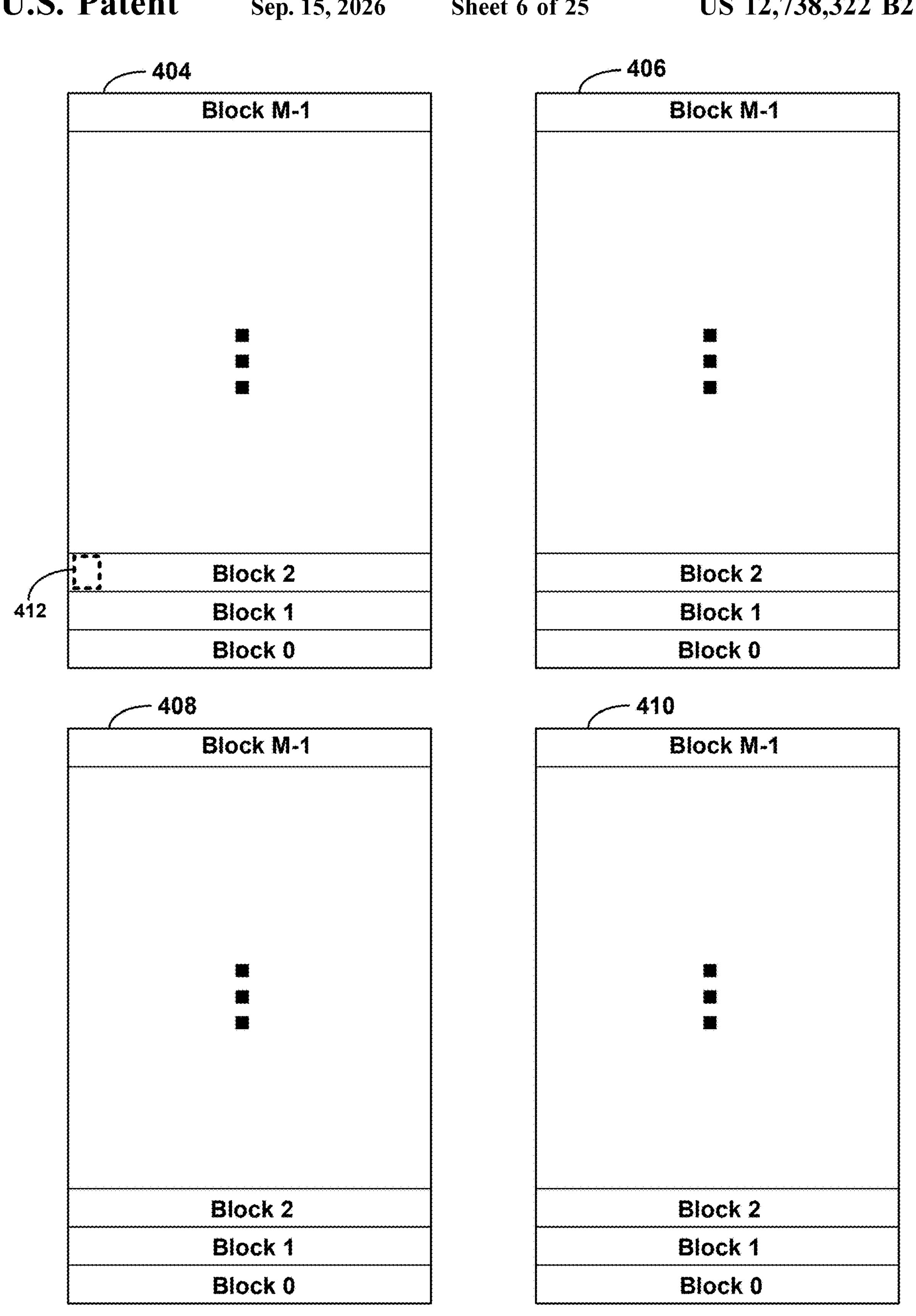
FIG. 4B is a block diagram of one embodiment of a memory structure having four planes.

FIG. 4B is a block diagram explaining one example organization of memory structure 202, which is divided into four planes 404, 406, 408 and 410. Each plane is then divided into M blocks. In one example, each plane has about 2000 blocks. However, different numbers of blocks and planes can also be used.

In one embodiment, a block of memory cells is a unit of erase. That is, all memory cells of a block are erased together. In other embodiments, blocks can be divided into sub-blocks and the sub-blocks can be the unit of erase. Memory cells also can be grouped into blocks for other reasons, such as to organize the memory structure to enable the signaling and selection circuits.

In some embodiments, a block represents a groups of connected memory cells as the memory cells of a block share a common set of word lines. For example, the word lines for a block are all connected to all of the vertical NAND strings for that block. Although FIG. 4B shows four planes, more or less than four planes can be implemented. In some embodiments, memory structure 202 includes eight planes.

Each block typically is divided into one or more pages. In an embodiment, a page is a unit of programming/writing and a unit of reading. Other units of programming also can be used. In an embodiment, one or more pages of data are typically stored in one row of memory cells. For example, one or more pages of data may be stored in memory cells connected to a common word line. In an embodiment, a page includes data stored in all memory cells connected to a common word line.

Figure 4C:
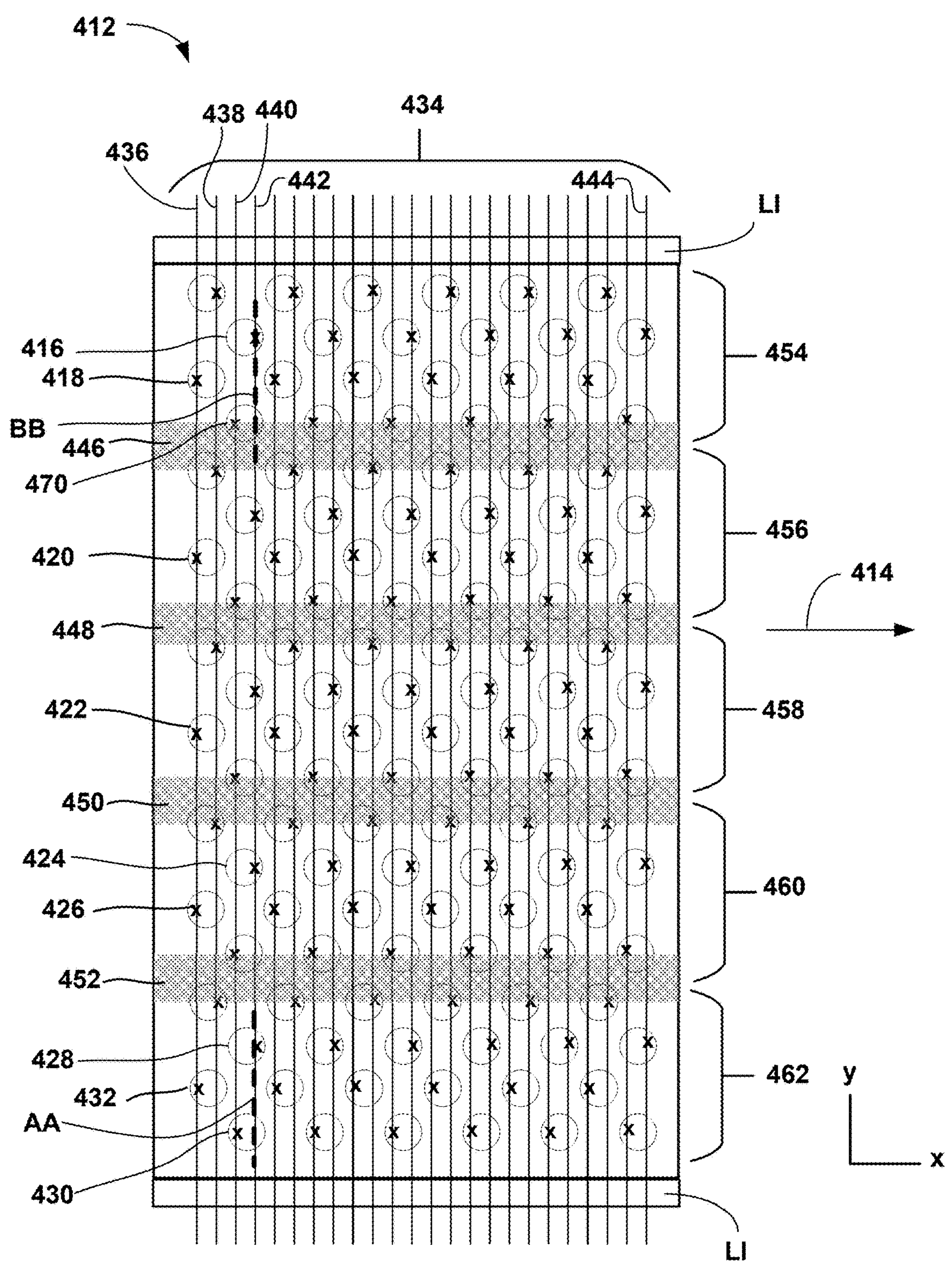
FIG. 4C depicts a top view of a portion of one embodiment of a block of memory cells.

FIGS. 4C-4G depict an example three dimensional ("3D") NAND structure that corresponds to the structure of FIG. 4A and can be used to implement memory structure 202 of FIGS. 2A and 2B. FIG. 4C is a block diagram depicting a top view of a portion 412 of Block 2 of plane 404. As can be seen from FIG. 4C, the block depicted in FIG. 4C extends in the direction 414. In an embodiment, the memory array has many layers. However, FIG. 4C only shows the top layer.

FIG. 4C depicts a plurality of circles that represent the memory holes, which are also referred to as vertical columns. Each of the memory holes/vertical columns include multiple select transistors (also referred to as a select gate or selection gate) and multiple memory cells. In one embodiment, each memory hole/vertical column implements a NAND string. For example, FIG. 4C labels a subset of the memory holes/vertical columns/NAND strings 416, 418, 420, 422, 424, 426, 428, 430 and 432.

FIG. 4C also depicts a set of bit lines 434, including bit lines 436, 438, 440, 442, . . . 444. FIG. 4C shows twenty four bit lines because only a portion of the block is depicted. It is contemplated that more than twenty four bit lines connected to memory holes/vertical columns of the block. Each of the circles representing memory holes/vertical columns has an "x" to indicate its connection to one bit line. For example, bit line 436 is connected to memory holes/vertical columns 418, 420, 422, 426 and 432.

The block depicted in FIG. 4C includes a set of isolation regions 446, 448, 450 and 452, which are formed of $SiO_2$. However, other dielectric materials also can be used. Isolation regions 446, 448, 450 and 452 serve to divide the top layers of the block into five regions For example, the top layer depicted in FIG. 4C is divided into regions 454, 456, 458, 460 and 462.

In one embodiment, the isolation regions only divide the layers used to implement select gates so that NAND strings in different regions can be independently selected. In one example implementation, a bit line connects to one memory hole/vertical column/NAND string in each of regions 454, 456, 458, 460 and 462. In that implementation, each block has twenty four rows of active columns and each bit line connects to five rows in each block.

In one embodiment, all five memory holes/vertical columns/NAND strings connected to a common bit line are connected to the same set of word lines. Therefore, the system uses the drain side selection lines to choose one (or another subset) of the five to be subjected to a memory operation (program, verify, read, and/or erase).

FIG. 4C also shows Line Interconnects LI, which are metal connections to the source line SL from above the memory array. Line Interconnects LI are positioned adjacent regions 454 and 462.

Although FIG. 4C shows each region 454, 456, 458, 460 and 462 having four rows of memory holes/vertical columns, five regions and twenty four rows of memory holes/vertical columns in a block, those exact numbers are an example implementation. Other embodiments may include more or less regions per block, more or less rows of memory holes/vertical columns per region and more or less rows of vertical columns per block.

FIG. 4C also shows the memory holes/vertical columns being staggered. In other embodiments, different patterns of staggering can be used. In some embodiments, the memory holes/vertical columns are not staggered.

Figure 4D:
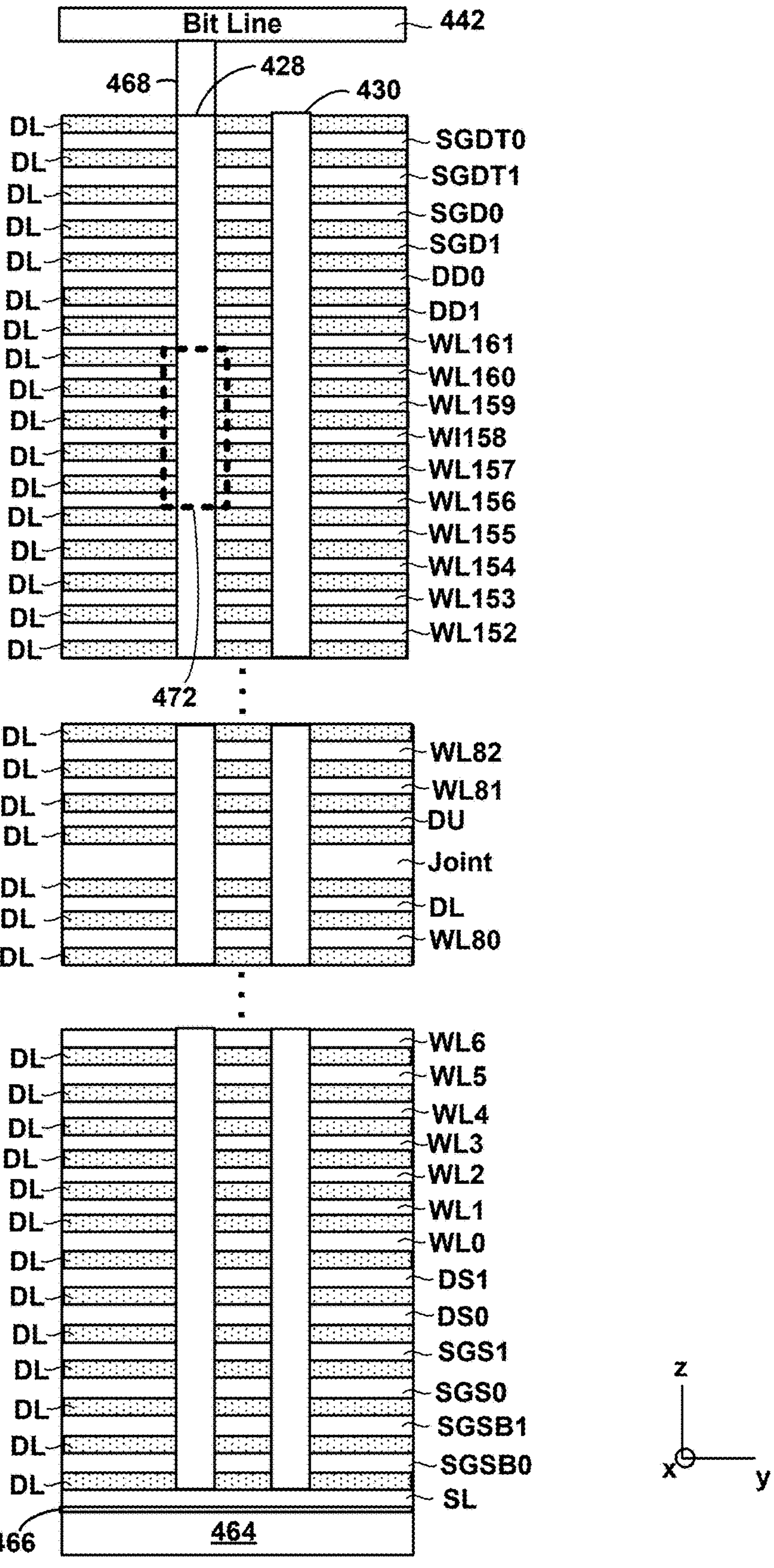
FIG. 4D depicts a cross sectional view of a portion of one embodiment of a block of memory cells.

FIG. 4D depicts a portion of one embodiment of a three dimensional memory structure 202 showing a cross-sectional view along line AA of FIG. 4C. This cross sectional view cuts through memory holes/vertical columns (NAND strings) 428 and 430 of region 462 (see FIG. 4C).

The structure of FIG. 4D includes two drain side select layers SGD0 and SGD1, two source side select layers SGS0 and SGS1, two drain side GIDL generation transistor layers SGDT0 and SGDT1, two source side GIDL generation transistor layers SGSB0 and SGSB1, two drain side dummy word line layers DD0 and DD1, two source side dummy word line layers DS0 and DS1, dummy word line layers DU and DL, one hundred and sixty two word line layers WL0-WL161 for connecting to data memory cells, and dielectric layers DL.

Other embodiments can implement more or less than the numbers described above for FIG. 4D. In one embodiment, SGD0 and SGD1 are connected together; and SGS0 and SGS1 are connected together. In other embodiments, more or less number of SGDs (greater or lesser than two) are connected together, and more or less number of SGS devices (greater or lesser than two) connected together.

In one embodiment, erasing the memory cells is performed using gate induced drain leakage (GIDL), which includes generating charge carriers at the GIDL generation transistors such that the carriers get injected into the charge trapping layers of the NAND strings to change threshold voltage of the memory cells. FIG. 4D shows two GIDL generation transistors at each end of the NAND string; however, in other embodiments there are more or less than three.

Embodiments that use GIDL at both sides of the NAND string may have GIDL generation transistors at both sides. Embodiments that use GIDL at only the drain side of the NAND string may have GIDL generation transistors only at the drain side. Embodiments that use GIDL at only the source side of the NAND string may have GIDL generation transistors only at the source side.

FIG. 4D shows two GIDL generation transistors at each end of the NAND string. It is likely that charge carriers are only generated by GIDL at one of the two GIDL generation transistors at each end of the NAND string. Based on process variances during manufacturing, it is likely that one of the two GIDL generation transistors at an end of the NAND string is best suited for GIDL.

For example, the GIDL generation transistors have an abrupt PN junction to generate the charge carriers for GIDL and, during fabrication, a phosphorous diffusion is performed at the polysilicon channel of the GIDL generation transistors. In some cases, the GIDL generation transistor with the shallowest phosphorous diffusion is the GIDL generation transistor that generates the charge carriers during erase. However, in some embodiments charge carriers can be generated by GIDL at multiple GIDL generation transistors at a particular side of the NAND string.

Memory holes/Vertical columns 428 and 430 are depicted protruding through the drain side select layers, source side select layers, dummy word line layers, GIDL generation transistor layers and word line layers. In one embodiment, each memory hole/vertical column comprises a vertical NAND string. Below the memory holes/vertical columns and the layers listed below is substrate 464, an insulating film 466 on the substrate, and source line SL. The NAND string of memory hole/vertical column 428 has a source end at a bottom of the stack and a drain end at a top of the stack. As in agreement with FIG. 4C, FIG. 4D show vertical memory hole/column 428 connected to bit line 442 via connector 468.

For ease of reference, drain side select layers, source side select layers, dummy word line layers, GIDL generation transistor layers and data word line layers collectively are referred to as conductive layers.

In one embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof.

In some embodiments, different conductive layers can be formed from different materials. Between conductive layers are dielectric layers DL. In one embodiment, the dielectric layers are made from $SiO_2$. In other embodiments, other dielectric materials can be used to form the dielectric layers.

The non-volatile memory cells are formed along memory holes/vertical columns which extend through alternating conductive and dielectric layers in the stack. In one embodiment, the memory cells are arranged in NAND strings. The word line layers WL0-WL161 connect to memory cells (also called data memory cells). Dummy word line layers connect to dummy memory cells.

A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0 and SGD1 are used to electrically connect and disconnect NAND strings from bit lines. Source side select layers SGS0 and SGS1 are used to electrically connect and disconnect NAND strings from the source line SL.

FIG. 4D shows that the memory array is implemented as a two tier architecture, with the tiers separated by a Joint area. In one embodiment it is expensive and/or challenging to etch so many word line layers intermixed with dielectric layers. To ease this burden, one embodiment includes laying down a first stack of word line layers (e.g., WL0-WL80) alternating with dielectric layers, laying down the Joint area, and laying down a second stack of word line layers (e.g., WL81-WL161) alternating with dielectric layers. The Joint area are positioned between the first stack and the second stack. In one embodiment, the Joint areas are made from the same materials as the word line layers. In other embodiments, there can no Joint area or there can be multiple Joint areas.

Figure 4E:
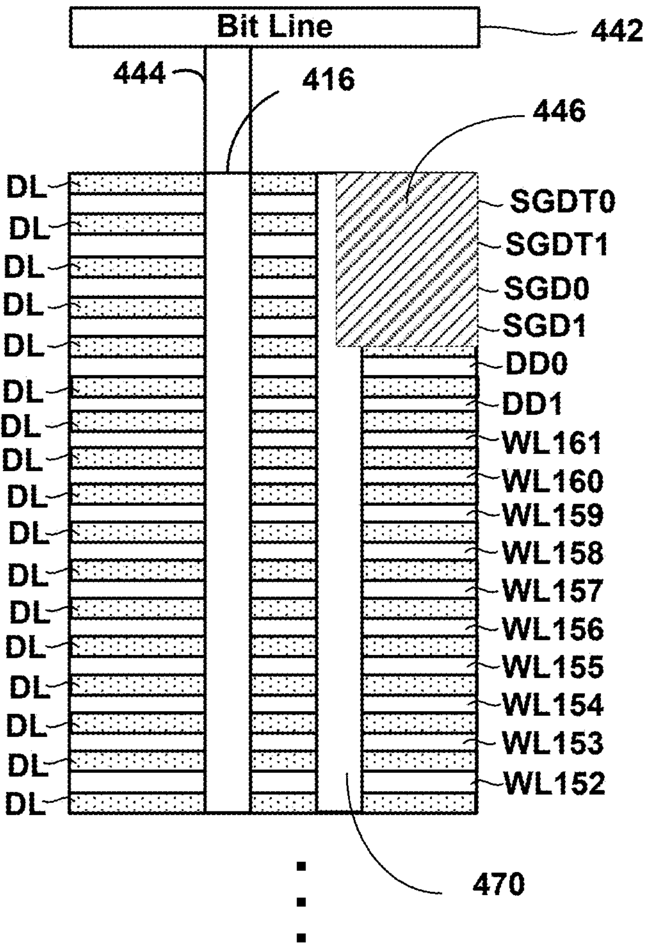
FIG. 4E depicts a cross sectional view of a portion of one embodiment of a block of memory cells.

FIG. 4E depicts a portion of one embodiment of a three dimensional memory structure 202 showing a cross-sectional view along line BB of FIG. 4C. This cross sectional view cuts through memory holes/vertical columns (NAND strings) 416 and 470 of region 454 (see FIG. 4C). FIG. 4E shows the same alternating conductive and dielectric layers as FIG. 4D.

FIG. 4E also shows isolation region 446. Isolation regions 446, 448, 450 and 452 occupy space that would have been used for a portion of the memory holes/vertical columns/NAND strings. For example, isolation region 446 occupies space that would have been used for a portion of memory hole/vertical column 470. More specifically, a portion (e.g., half the diameter) of vertical column 470 has been removed in layers SGDT0, SGDT1, SGD0, and SGD1 to accommodate isolation region 446.

Thus, while most of the vertical column 470 is cylindrical (with a circular cross section), the portion of vertical column 470 in layers SGDT0, SGDT1, SGD0, and SGD1 has a semi-circular cross section. In one embodiment, after the stack of alternating conductive and dielectric layers is formed, the stack is etched to create space for the isolation region and that space is then filled in with $SiO_2$. This structure allows for separate control of SGDT0, SGDT1, SGD0, and SGD1 for regions 454, 456, 458, 460, and 462.

Figure 4F:
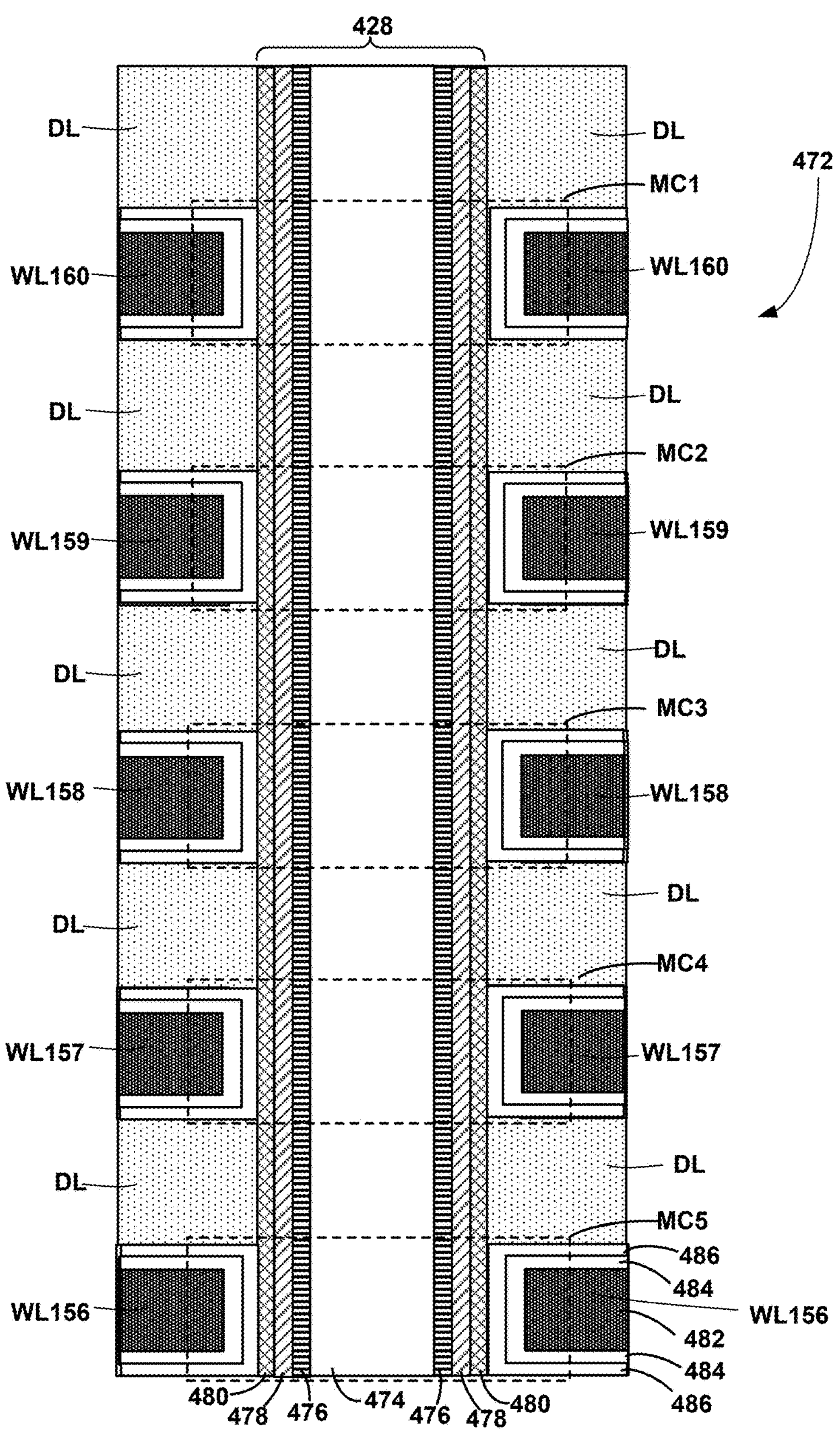
FIG. 4F is a cross sectional view of one embodiment of a vertical column of memory cells.

FIG. 4F depicts a cross sectional view of region 472 of FIG. 4D that includes a portion of memory hole/vertical column 428. In one embodiment, the memory holes/vertical columns are round. However, in other embodiments other shapes can be used. In one embodiment, memory hole/vertical column 428 includes an inner core layer 474 that is made of a dielectric, such as $SiO_2$. Other materials can also be used.

Surrounding inner core 474 is polysilicon channel 476. Materials other than polysilicon can also be used. Note that it is the channel 476 that connects to the bit line and the source line. Surrounding channel 476 is a tunneling dielectric 478. In one embodiment, tunneling dielectric 478 has an ONO structure. Surrounding tunneling dielectric 478 is charge trapping layer 480, such as (for example) Silicon Nitride. Other memory materials and structures can also be used. The technology described herein is not limited to any particular material or structure.

FIG. 4F depicts dielectric layers DL as well as word line layers WL160, WL159, WL158, WL157, and WL156. Each of the word line layers includes a word line region 482 surrounded by an aluminum oxide layer 484, which is surrounded by a blocking oxide layer 486. In other embodiments, the blocking oxide layer can be a vertical layer parallel and adjacent to charge trapping layer 480. The physical interaction of the word line layers with the vertical column forms the memory cells.

Thus, in one embodiment a memory cell includes channel 476, tunneling dielectric 478, charge trapping layer 480, blocking oxide layer 486, aluminum oxide layer 484 and word line region 482. For example, word line layer WL160 and a portion of memory hole/vertical column 428 comprise a memory cell MC1. Word line layer WL159 and a portion of memory hole/vertical column 428 comprise a memory cell MC2. Word line layer WL158 and a portion of memory hole/vertical column 428 comprise a memory cell MC3. Word line layer WL157 and a portion of memory hole/vertical column 428 comprise a memory cell MC4. Word line layer WL156 and a portion of memory hole/vertical column 428 comprise a memory cell MC5. In other architectures, a memory cell may have a different structure; however, the memory cell would still be the storage unit.

When a memory cell is programmed, electrons are stored in a portion of the charge trapping layer 480 which is associated with (e.g. in) the memory cell. These electrons are drawn into the charge trapping layer 480 from the channel 476, through the tunneling dielectric 478, in response to an appropriate voltage on word line region 482. The threshold voltage (Vth) of a memory cell is increased in proportion to the amount of stored charge.

In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
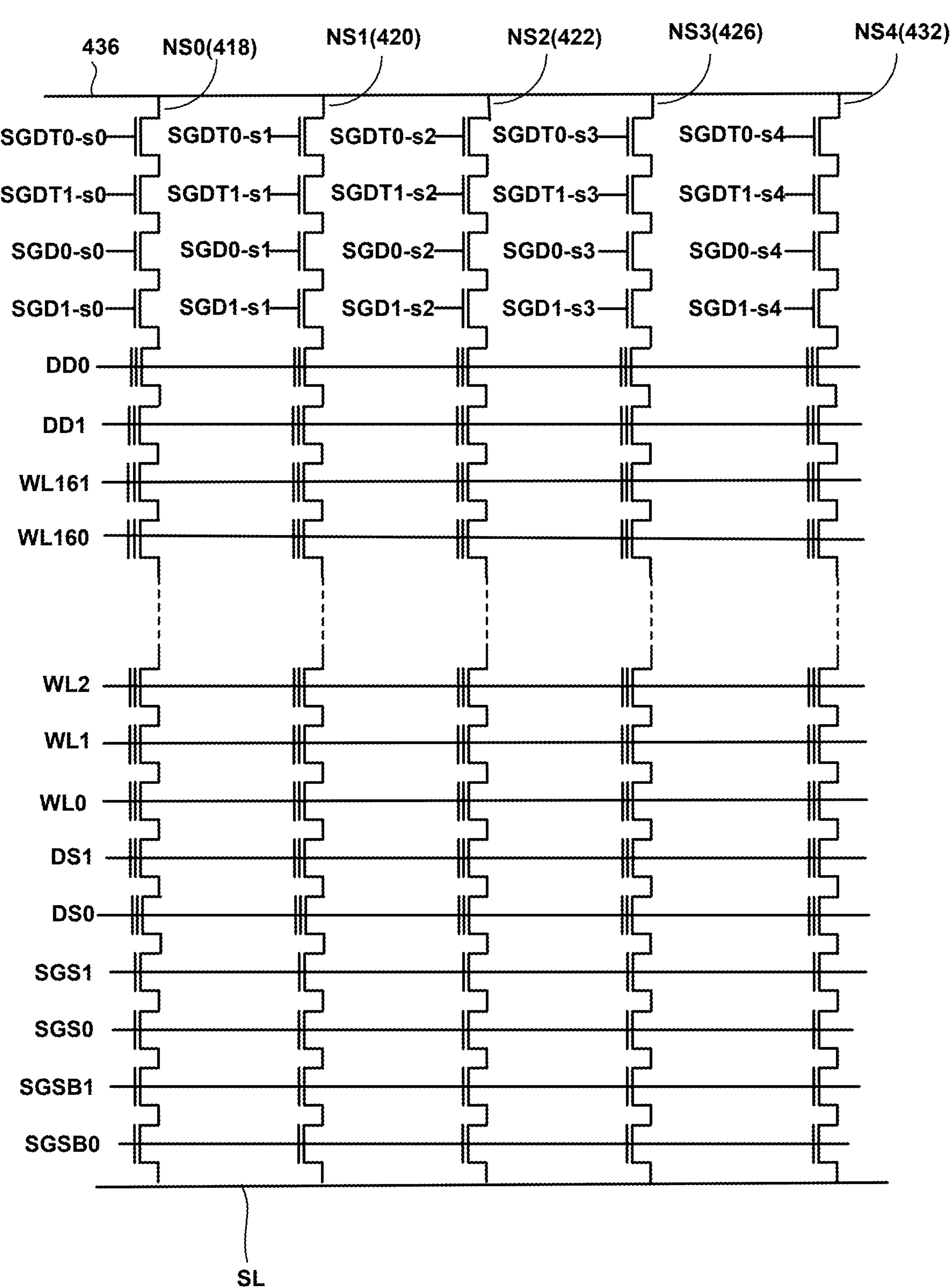
FIG. 4G is a schematic of a plurality of NAND strings in multiple regions of a same block.

FIG. 4G is a schematic diagram of a portion of the three dimensional memory structure 202 depicted in FIGS. 4B-4F. FIG. 4G shows physical data word lines WL0-WL161 running across the entire block. The structure of FIG. 4G corresponds to a portion 412 in Block 2 of FIG. 4B, including bit line 436. In an embodiment, within the block each bit line is connected to five NAND strings, one in each region of regions 454, 456, 458, 460, 462.

Thus, FIG. 4G shows bit line 436 connected to NAND string NS0 (which corresponds to memory hole/vertical column 418 of region 454), NAND string NS1 (which corresponds to memory hole/vertical column 420 of region 456), NAND string NS2 (which corresponds to vertical column 422 of region 458), NAND string NS3 (which corresponds to memory hole/vertical column 426 of region 460), and NAND string NS4 (which corresponds to memory hole/vertical column 432 of region 462).

Drain side select line/layer SGD0 is separated by isolation regions 446, 448, 450 and 452 to form SGD0-*s*0, SGD0-*s*1, SGD0-*s*2, SGD0-*s*3 and SGD0-*s*4 to separately connect to and independently control regions 454, 456, 458, 460, 462.

Similarly, drain side select line/layer SGD1 is separated by isolation regions 446, 448, 450 and 452 to form SGD1-*s*0, SGD1-*s*1, SGD1-*s*2, SGD1-*s*3 and SGD1-*s*4 to separately connect to and independently control regions 454, 456, 458, 460, 462.

Drain side GIDL generation transistor control line/layer SGDT0 is separated by isolation regions 446, 448, 450 and 452 to form SGDT0-*s*0, SGDT0-*s*1, SGDT0-*s*2, SGDT0-*s*3 and SGDT0-*s*4 to separately connect to and independently control regions 454, 456, 458, 460, 462.

Drain side GIDL generation transistor control line/layer SGDT1 is separated by isolation regions 446, 448, 450 and 452 to form SGDT1-*s*0, SGDT1-*s*1, SGDT1-*s*2, SGDT1-*s*3 and SGDT1-*s*4 to separately connect to and independently control regions 454, 456, 458, 460, 462.

FIG. 4G only shows NAND strings connected to bit line 436. However, a full schematic of the block would show every bit line and five vertical NAND strings (that are in separate regions) connected to each bit line.

Although the example memories of FIGS. 4B-4G are three dimensional memory structures that include vertical NAND strings with charge-trapping material, other (2D and 3D) memory structures can also be used with the technology described herein.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate.

Figure 5A:
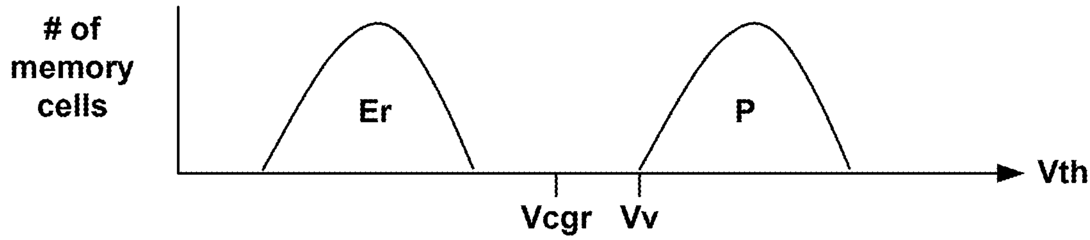
FIGS. 5A-5D are diagrams each depicting example threshold voltage distributions.

FIG. 5A is a diagram of example threshold voltage versus number of memory cells, and illustrates example threshold voltage distributions for the memory array when each memory cell stores one bit of data per memory cell. Memory cells that store one bit of data per memory cell data are referred to as single level cells ("SLC").

FIG. 5A shows two threshold voltage distributions: Er and P. Threshold voltage distribution Er corresponds to an erased data state, and threshold voltage distribution P corresponds to a programmed data state. Memory cells that have threshold voltages in threshold voltage distribution Er are in the erased data state. Memory cells that have threshold voltages in threshold voltage distribution P are in the programmed data state.

In one embodiment, erased memory cells store data "1" and programmed memory cells store data "0." FIG. 5A depicts read reference voltage VCGR. By testing (e.g., performing one or more sense operations) whether the threshold voltage of a given memory cell is above or below VCGR, the system can determine whether a memory cells is erased (state Er) or programmed (state P). FIG. 5A also depicts verify reference voltage Vv. In some embodiments, when programming memory cells to data state P, the system will test whether those memory cells have a threshold voltage greater than or equal to Vv.

In general, during read operations, a selected word line is connected to read reference voltage VCGR, and a conduction current of the memory cell is measured to determine whether the memory cell turned ON (conducted current) in response to the voltage applied to the word line. If the conduction current is measured to be greater than a certain value, then it is assumed that the memory cell turned ON and the threshold voltage of the memory cell is less than the voltage applied to the word line.

In contrast, if the conduction current is not measured to be greater than the certain value, then it is assumed that the memory cell did not turn ON and the threshold voltage of the memory cell is greater than the voltage applied to the word line. During a read process, unselected memory cells are provided with a read pass voltage $V_{READ}$ (also referred to as a bypass voltage) at their control gates so that these memory cells will operate as pass gates (e.g., conducting current regardless of whether they are programmed or erased).

Figure 5B:
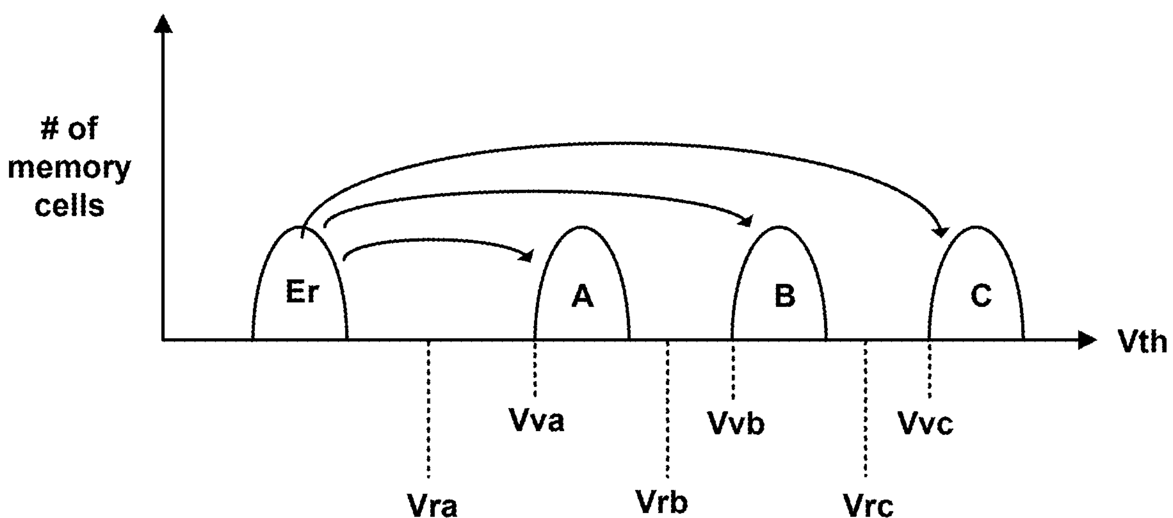
Figures 5C, 5D:
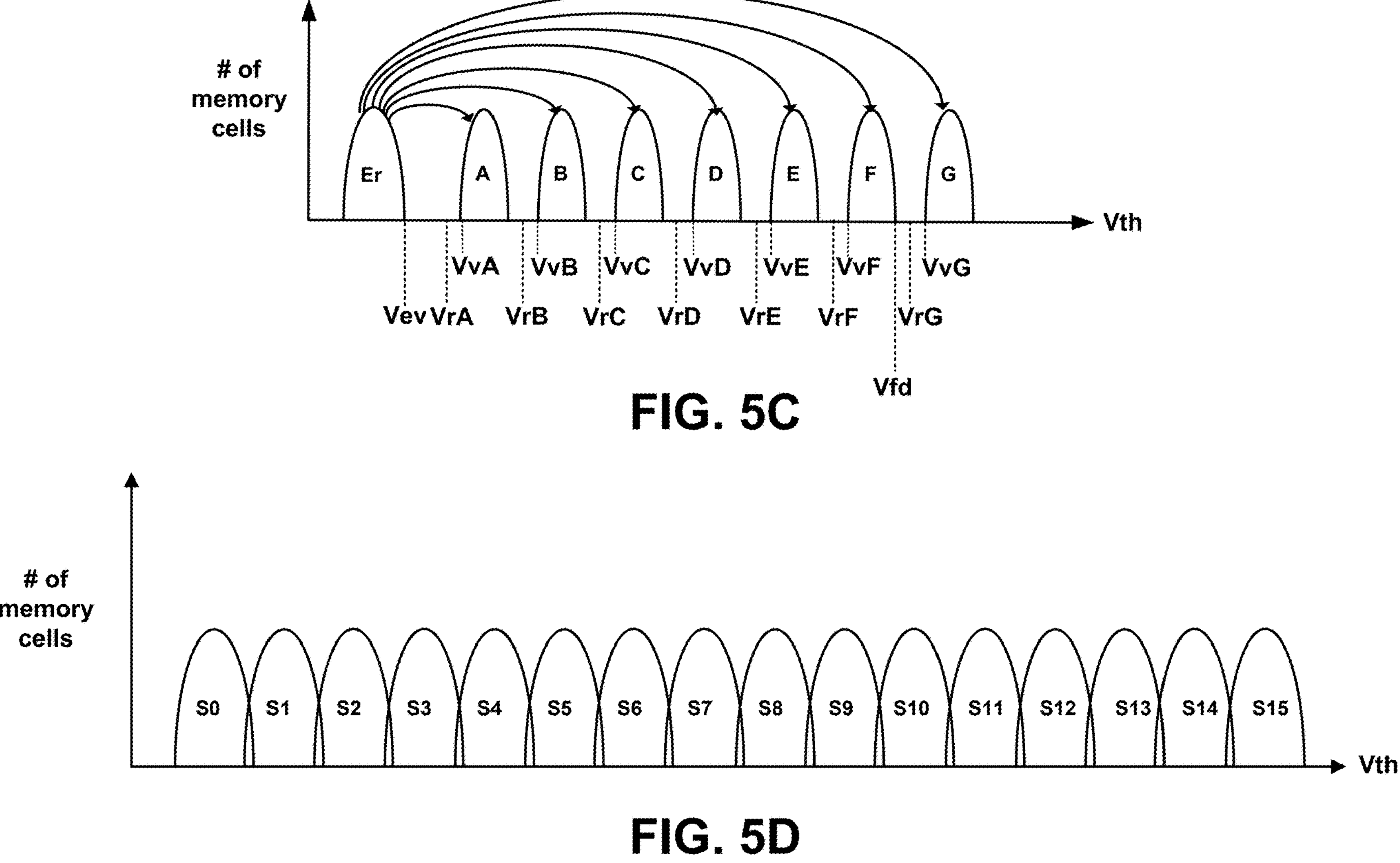

FIGS. 5B-D illustrate example threshold voltage distributions for a memory array in which each memory cell stores multiple bit per memory cell data. Memory cells that store multiple bit per memory cell data are referred to as multi-level cells (MLC). The data stored in MLC memory cells are referred to as MLC data. In the example embodiment of FIG. 5B, each memory cell stores two bits of data. Other embodiments may use other data capacities per memory cell (e.g., such as three, four, or five or more bits of data per memory cell).

FIG. 5B shows a first threshold voltage distribution Er for erased memory cells. Three threshold voltage distributions A, B and C for programmed memory cells also are depicted. In an embodiment, the threshold voltages in the distribution Er are negative and the threshold voltages in distributions A, B and C are positive. Each distinct threshold voltage distribution of FIG. 5B corresponds to predetermined values for the set of data bits.

In one embodiment, the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

| | Er | A | B | C |
|---|---|---|---|---|
| LP | 1 | 0 | 0 | 1 |
| UP | 1 | 1 | 0 | 0 |

In one embodiment, known as full sequence programming, memory cells can be programmed from the erased data state Er directly to any of the programmed data states A, B or C. For example, a population of memory cells to be programmed may first be erased so that all memory cells in the population are in erased data state Er. Then, a programming process is used to program memory cells directly into data states A, B, and/or C.

For example, while some memory cells are being programmed from erased data state Er to data state A, other memory cells are being programmed from erased data state Er to data state B and/or from erased data state Er to data state C. The arrows of FIG. 5B represent full sequence programming. In some embodiments, data states A-C can overlap, with memory controller 104 (or control die 240) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (erased data state) Er represents memory cells that are erased. The other seven threshold voltage distributions (data states) A-G represent memory cells that are programmed and, therefore, also are called programmed states.

Each threshold voltage distribution (data state) corresponds to predetermined values for the set of data bits. The specific relationship between the data programmed into the memory cell and the threshold voltage levels of the cell depends upon the data encoding scheme adopted for the cells.

In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

| | Er | A | B | C | D | E | F | G |
|---|---|---|---|---|---|---|---|---|
| LP | 1 | 1 | 1 | 0 | 0 | 0 | 0 | 1 |
| MP | 1 | 1 | 0 | 0 | 1 | 1 | 0 | 0 |
| UP | 1 | 0 | 0 | 0 | 0 | 1 | 1 | 1 |

FIG. 5C shows seven read reference voltages, VrA, VrB, VIC, VrD, VrE, VrF, and VrG for reading data from memory cells. By testing (e.g., performing sense operations) whether the threshold voltage of a given memory cell is above or below the seven read reference voltages, the system can determine what data state (e.g., A, B, C, D, . . . ) a memory cell is in.

FIG. 5C also shows seven verify reference voltages, VvA, VvB, VvC, VvD, VvE, VvF, and VvG. In some embodiments, when programming memory cells to data states A, B, C, D, E, F and G, the system will test whether those memory cells have a threshold voltage greater than or equal to VvA, VvB, VvC, VvD, VvE, VvF and VvG, respectively. FIG. 5C also shows Vev, which is an erase verify reference voltage to test whether a memory cell has been properly erased.

In an embodiment that utilizes full sequence programming, memory cells can be programmed from the erased data state Er directly to any of the programmed data states A-G. For example, a population of memory cells to be programmed may first be erased so that all memory cells in the population are in erased data state Er. Then, a programming process is used to program memory cells directly into data states A, B, C, D, E, F, and/or G.

For example, while some memory cells are being programmed from erased data state Er to data state A, other memory cells are being programmed from erased data state Er to data state B and/or from erased data state Er to data state C, and so on. The arrows of FIG. 5C represent the full sequence programming. In some embodiments, data states A-G can overlap, with memory controller 104 and/or control die 240 relying on error correction to identify the correct data being stored. In some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages/levels VrA, VrB, VrC, VrD, VrE, VrF, and VrG, of FIG. 5C) or verify operation (e.g. see verify target voltages/levels VvA, VvB, VvC, VvD, VvE, VvF, and VvG of FIG. 5C) to determine whether a threshold voltage of the concerned memory cell has reached such level.

After applying the word line voltage, the conduction current of the memory cell is measured to determine whether the memory cell turned ON (conducted current) in response to the voltage applied to the word line. If the conduction current is measured to be greater than a certain value, then it is assumed that the memory cell turned ON and the voltage applied to the word line is greater than the threshold voltage of the memory cell.

If the conduction current is not measured to be greater than the certain value, then it is assumed that the memory cell did not turn ON and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in a sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. The technology described herein can be used with different methods known in the art for verifying/reading. Other read and verify techniques known in the art can also be used.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage).

Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities.

In some embodiments, the threshold voltage distributions for a population of memory cells storing four bits of data per memory cell do not overlap and are separated from each other. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits.

The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 1 | 1 | 1 | 1 | 0 | 0 | 0 | 0 | 0 | 1 | 1 | 0 | 0 | 0 | 1 |
| UP | 1 | 1 | 0 | 0 | 0 | 0 | 0 | 0 | 1 | 1 | 1 | 1 | 1 | 1 | 0 | 0 |
| MP | 1 | 1 | 1 | 0 | 0 | 0 | 0 | 1 | 1 | 0 | 0 | 0 | 0 | 1 | 1 | 1 |
| LP | 1 | 0 | 0 | 0 | 1 | 1 | 0 | 0 | 0 | 0 | 0 | 1 | 1 | 1 | 1 | 1 |

Figure 6:
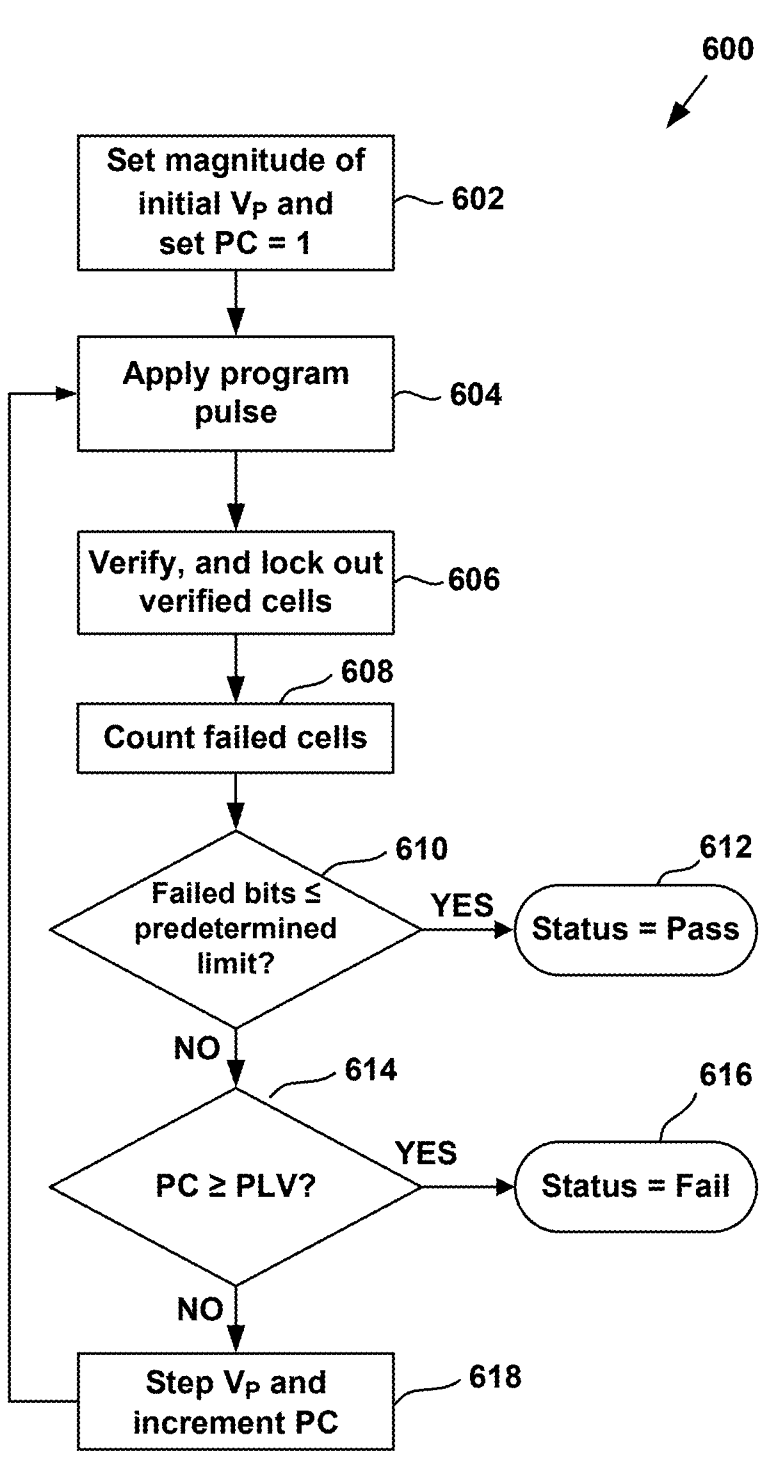
FIG. 6 is a flowchart describing an embodiment of a process for programming non-volatile memory.

FIG. 6 is a flowchart describing an embodiment of a process 600 for programming a memory cell. In an example embodiment, process 600 is performed on memory die 106 (FIG. 1), memory die 200 (FIG. 2A) or memory die 238 (FIG. 2B) using the control circuits discussed above. For example, process 600 can be performed at the direction of state machine 228 (FIGS. 2A-2B). Process 600 also can be used to implement the full sequence programming discussed above. Additionally, process 600 can be used to implement each phase of a multi-phase programming process.

In step 602, a programming voltage ($V_P$) is initialized to a starting program voltage $V_{Pinit}$ (e.g., between about 12V to about 16V, or some other value) and a program counter PC maintained by state machine 228 is initialized at 1.

In step 604, a program pulse having a magnitude $V_P$ is applied to the selected word line (the word line selected for programming). In an embodiment, the group of memory cells being concurrently programmed are all connected to the same word line (the selected word line). If a memory cell is to be programmed, then the corresponding bit line coupled to the memory cell is grounded.

If a memory cell should remain at its current threshold voltage, then the corresponding bit line coupled to the memory cell is connected to Vdd to inhibit programming. In an embodiment, the unselected word lines receive one or more boosting voltages (e.g., between about 7V to about 11V, or some other value) to perform boosting schemes known in the art.

In step 604, the program pulse is applied to all memory cells connected to the selected word line so that all of the connected memory cells are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 606, the memory cells are verified using the appropriate set of verify reference voltages to perform one or more verify operations. In an embodiment, the verification process is performed by testing whether the threshold voltages of the memory cells selected for programming have reached the appropriate verify reference voltage.

In step 608, the memory system counts the number of memory cells that have not yet reached their respective target threshold voltage distribution. That is, the system counts the number of memory cells that have so far failed the verify process. This counting can be done by controller 104 (FIG. 1), state machine 228 (FIGS. 2A-2B), control die 240 (FIG. 2B), or other logic. In the remaining discussion, the term "Controller Device" may be one or more of controller 104 (FIG. 1), state machine 228 (FIGS. 2A-2B), control die 240 (FIG. 2B) or other similar controller device.

In an embodiment, each of sense amps 218 (FIG. 2A) stores the status (pass/fail) of their respective memory cells. In an embodiment, one total count reflects the total number of memory cells currently being programmed that have failed the last verify step. In another embodiment, separate counts are kept for each data state.

In step 610, a determination is made whether the count from step 608 is less than or equal to a predetermined limit. In an embodiment, the predetermined limit is the number of bits that can be corrected by error correction codes (ECC) during a read process for the page of memory cells.

If the number of failed cells is less than or equal to the predetermined limit, than the programming process can stop and a status of "PASS" is reported in step 612. In this situation, enough memory cells programmed correctly such that the few remaining memory cells that have not been completely programmed can be corrected using ECC during the read process.

In some embodiments, the predetermined limit used in step 610 is below the number of bits that can be corrected by error correction codes (ECC) during a read process to allow for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, the limit changes based on the number of errors already counted for the page, the number of program-erase cycles performed or other criteria.

If the number of failed memory cells is not less than the predetermined limit, then the programming process continues at step 614 and the program counter PC is checked against a program limit value (PLV). Examples of program limit values include 6, 12, 16, 20 and 30, although other values can be used. If the program counter PC is greater than or equal to program limit value PLV, then the program process is considered to have failed and a status of FAIL is reported in step 616.

If the program counter PC is not greater than or equal to program limit value PLV, then the process continues at step 618 in which the Program Counter PC is incremented by 1 and program voltage $V_P$ is stepped up to the next magnitude. For example, the next program pulse will have a magnitude greater than the previous pulse by a program step size $\Delta V_P$ (e.g., a step size of between about 0.1V to about 1.0V, or some other value). The process loops back to step 604 and another program pulse is applied to the selected word line so that another iteration (steps 604-618) of programming process 600 is performed. Each pass through steps 604-618 is referred to herein as a "program loop."

In general, during verify operations and read operations, the selected word line is connected to a voltage (one example of a reference signal), a level of which is specified for each read operation (e.g., read compare levels VrA, VrB, VrC, VrD, VrE, VrF, and VrG, of FIG. 5C) or verify operation (e.g. verify target levels VvA, VvB, VvC, VvD, VvE, VvF, and VvG of FIG. 5C) to determine whether a threshold voltage of the selected memory cell has reached such level.

In an embodiment, after an appropriate read or verify voltage is applied to a selected word line, a conduction current of the memory cell is measured to determine whether the memory cell turned ON (conducts current) in response to the voltage applied to the word line. If the conduction current is measured to be greater than a certain value, then it is assumed that the memory cell turned ON and the voltage applied to the word line is greater than the threshold voltage of the memory cell.

If the conduction current is measured to be not greater than the certain value, then the memory cell did not turn ON, and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate at which the memory cell discharges or charges a dedicated capacitor in a sense amplifier. In another example, the conduction current of the selected memory cell allows (or fails to allow) the NAND string that includes the memory cell to discharge a corresponding bit line. The voltage on the bit line is measured after a period of time to see whether or not the bit line has been discharged. Note that the technology described herein can be used with different methods known in the art for verifying/reading. Other read and verify techniques known in the art also can be used.

As described above, at step 604 a program pulse is applied to the selected word line, and at step 606 memory cells coupled to the selected word line are verified using an appropriate set of verify reference voltages to perform one or more verify operations. Steps 604 and 606 are part of an iterative loop in which program pulses are applied as a series of program pulses that step up in magnitude, with intervening verify reference pulses between consecutive program pulses. Such an iterative loop is referred to herein as a "program-verify iteration."

Figure 7:
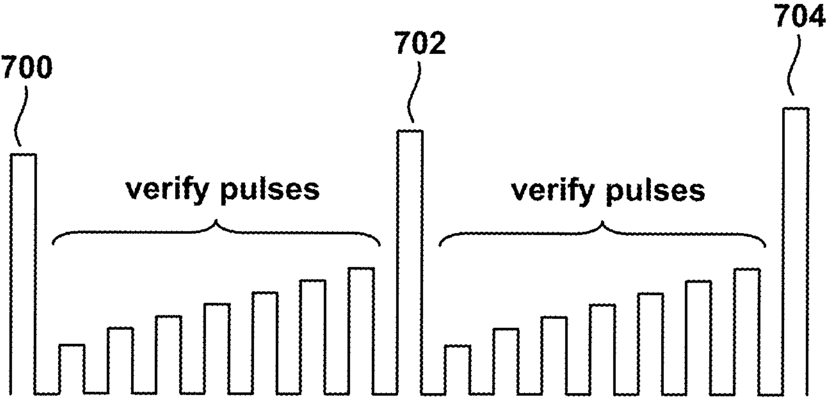
FIG. 7 depicts a word line voltage during programming and verify operations.

FIG. 7 illustrates an example of such program-verify pulses applied to a selected word line. In particular, FIG. 7 depicts program pulses 700, 702 and 704 applied to the selected word line during three successive iterations of step 604 of FIG. 6. Between program pulses 700, 702 and 704 verify pulses are applied to the selected word line during three successive program-verify iterations of steps 604-606 of FIG. 6 to determine whether threshold voltages of the memory cells are greater than the respective verify reference voltages.

As described above, in embodiments a population of memory cells to be programmed is first erased so that all memory cells in the population are in an erased data state (e.g., state Er in FIGS. 5A-5C or state S0 in FIG. 5D) prior to programming. When the programmed memory cells are subsequently selected to be re-programmed, the memory cells are again erased prior to programming.

Figures 8A, 8B:
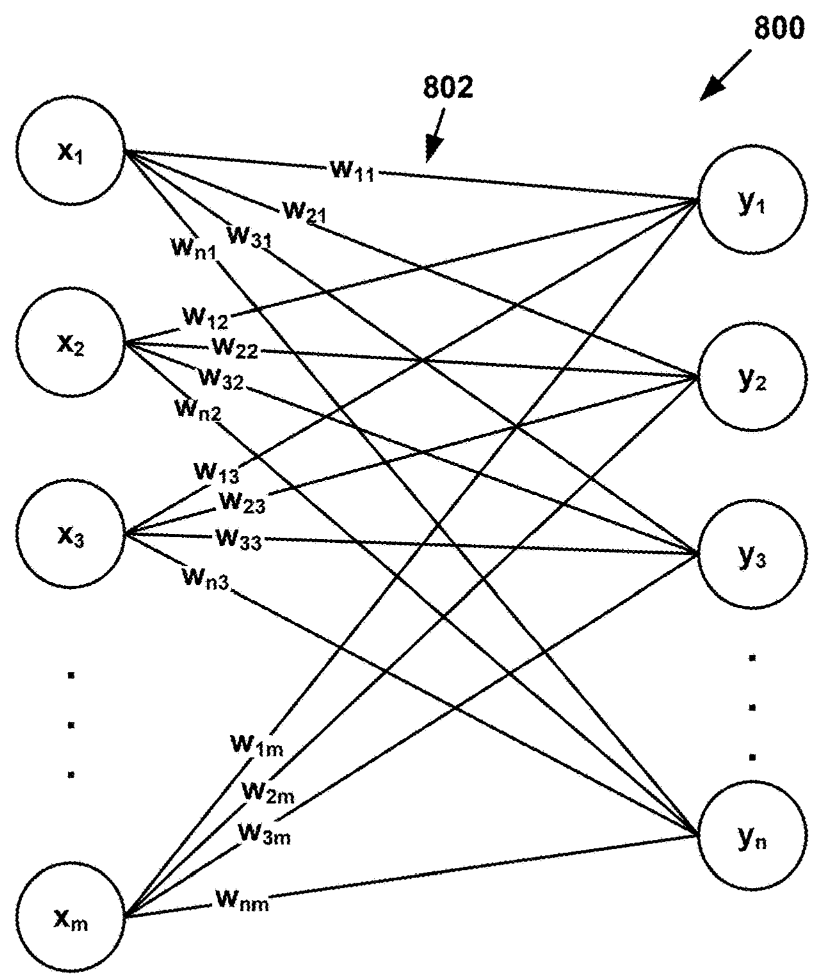
FIG. 8A shows an example of an artificial neural network.
FIG. 8B depicts a matrix-vector multiplication operation of the artificial neural network of FIG. 8A.

In an embodiment, non-volatile memory cells are used to perform VMM in a neuromorphic computing system. A neuromorphic computing system may be used to implement an artificial neural network. FIG. 8A depicts an example of an artificial neural network 800 that includes input neurons $x_1, x_2, x_3, \ldots, x_m$, output neurons $y_1, y_2, y_3, \ldots, y_n$, and synapses 802 that connect input neurons $x_1, x_2, x_3, \ldots, x_m$ to output neurons $y_1, y_2, y_3, \ldots, y_n$. In an embodiment, each synapse 802 has a corresponding weight $w_{11}$, $w_{12}$, $w_{13}, \ldots, w_{nm}$.

In an embodiment, each input neuron $x_1, x_2, x_3, \ldots, x_m$ has an associated value, each output neuron $y_1, y_2, y_3, \ldots, y_n$ has an associated value, and each weight $w_{11}$, $w_{12}, w_{13}, \ldots, w_{nm}$ has an associated value. The value of each output neuron $y_1, y_2, y_3, \ldots, y_n$ may be determined as follows:

$$y_k = \sum_{j=1}^{m} x_j w_{kj},\ k = 1, 2, \ldots, n \tag{1}$$

In matrix notation, Equation (1) may be written as $y=x^TW$, where y is an n-element output vector, x is an m-element input vector, and W is an m×n array of weights, as depicted in FIG. 8B.

The VMM operation depicted in FIG. 8B may be implemented by multiply and accumulate operations, in which each output neuron $y_1, y_2, y_3, \ldots, y_n$ has an associated value equal to the sum of products of each input neuron $x_1$, $x_2, x_3, \ldots, x_m$ with the corresponding weight $w_{11}$, $w_{12}$, $w_{13}, \ldots, w_{nm}$ that connects each respective input neuron $x_1$, $x_2, x_3, \ldots, x_m$ to the output neuron $y_1, y_2, y_3, \ldots, y_n$.

So, for example, with m=4 and n=3, $$y_1 = x_1 w_{11} + x_2 w_{12} + x_3 w_{13} + x_4 w_{14} \tag{2}$$

$$y_2 = x_1 w_{21} + x_2 w_{22} + x_3 w_{23} + x_4 w_{24} \tag{3}$$

$$y_3 = x_1 w_{31} + x_2 w_{32} + x_3 w_{33} + x_4 w_{34} \tag{4}$$

Figure 9A:
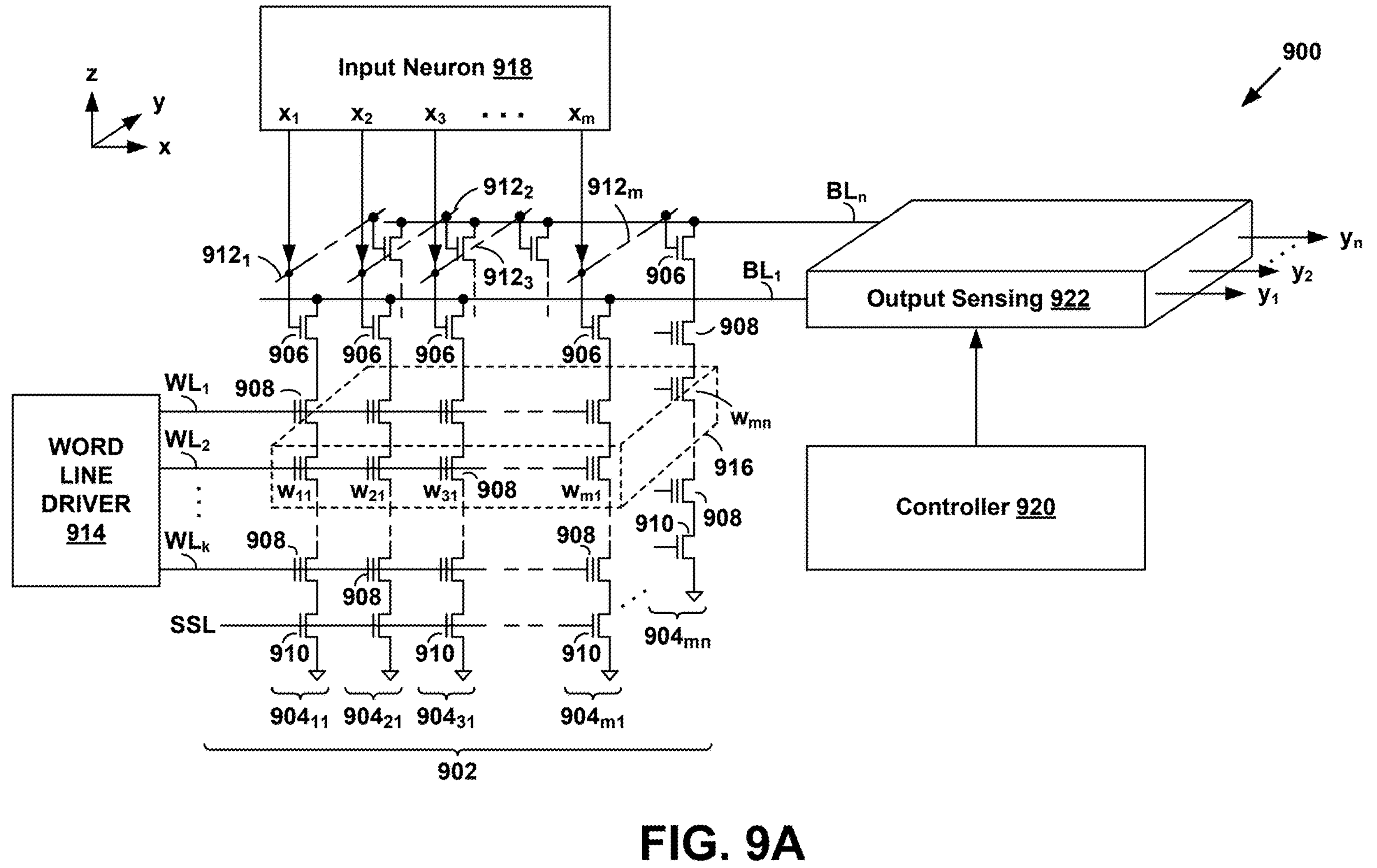
FIG. 9A depicts an example time-based vector-matrix multiplication circuit implemented using a 3D NAND cross-point memory structure.

In an embodiment, a 3D NAND-based cross-point memory structure is used to perform VMM operations. FIG. 9A depicts an example time-based VMM circuit 900 implemented using a 3D NAND cross-point memory structure.

In an embodiment, time-based VMM circuit 900 includes a non-volatile memory structure 902, which may be an instance of memory structure 202 of FIGS. 2A-2B. In an embodiment, non-volatile memory structure 902 includes an (n×m) array of non-volatile memory cells arranged as vertical NAND strings, such as example NAND strings $\mathbf{904}_{11}$, $\mathbf{904}_{21}$, $\mathbf{904}_{31}, \ldots, \mathbf{904}_{mn}$ that are arranged in an x-y plane and each extend in a z-direction. Accordingly, non-volatile memory structure 902 is also referred to herein as NAND array 902.

In an embodiment, each NAND string $\mathbf{904}_{xy}$ includes one or more drain side select transistors 906, memory cells 908 and one or more source side select transistors 910. In an embodiment, drain side select lines $\mathbf{912}_1$, $\mathbf{912}_2$, $\mathbf{912}_3, \ldots$, $\mathbf{912}_m$ are coupled to drain side select transistors 906. In an embodiment, each drain side select line $\mathbf{912}_x$ is coupled to a control gate of drain side select transistors 906 of all NAND strings $\mathbf{904}_{xy}$ at the same x-location.

For example, drain side select line $\mathbf{912}_1$ is coupled to control gates of drain side select transistors 906 of NAND strings $\mathbf{904}_{11}$, $\mathbf{904}_{12}$, $\mathbf{904}_{13}, \ldots, \mathbf{904}_{1n}$, drain side select line $\mathbf{912}_2$ is coupled to control gates of drain side select transistors 906 of NAND strings $\mathbf{904}_{21}$, $\mathbf{904}_{22}$, $\mathbf{904}_{23}, \ldots$, $\mathbf{904}_{2n}, \ldots$, drain side select line $\mathbf{912}_m$ is coupled to control gates of drain side select transistors 906 of NAND strings $\mathbf{904}_{m1}$, $\mathbf{904}_{m2}$, $\mathbf{904}_{m3}, \ldots, \mathbf{904}_{mn}$.

In an embodiment, each NAND string $\mathbf{904}_{xy}$ includes k memory cells 908, and a word line driver circuit 914 provides k word lines $WL_1, WL_2, WL_3, \ldots, WL_k$ that are coupled to control terminals of a corresponding row of memory cells 908 in each NAND string $\mathbf{904}_{xy}$. In an embodiment, a source side select line SSL is coupled to control gates of source side select transistors 910.

In an embodiment, weights $w_{11}, w_{21}, w_{31}, \ldots, w_{mn}$ of a neuromorphic computing system are mapped to memory cells 908. In an embodiment, one of word lines $WL_1$, $WL_2$, $WL_3, \ldots, WL_k$ is selected at a time, with all other word lines being unselected word lines biased to read pass voltage $V_{READ}$. In the example depicted in FIG. 9A, word line $WL_2$ is the selected word line, and is coupled to memory cells 908 in layer 916. In the illustrated example, weights $w_{11}$, $w_{21}$, $w_{31}, \ldots, w_{mn}$ are mapped to memory cells 908 in layer 916. Persons of ordinary skill in the art will understand that word lines other than word line $WL_2$ may be the selected word line.

In an embodiment, the selected word line (word line $WL_2$ in the example of FIG. 9A) is biased to a selected word line voltage $V_{SWL}$ (e.g., 2V), and weights $w_{11}, w_{21}, w_{31}, \ldots, w_{mn}$ are programmed as device currents in memory cells 908 in layer 916. In an embodiment, memory cells 908 are programmed by converting each weight $w_{11}, w_{21}, w_{31}, \ldots, w_{mn}$ to a corresponding memory cell current $I_{cell\text{-}xy}$:

$$I_{cell-xy} = I_{min} + \Delta I_{max}\left(\frac{|w_{xy}|}{|W_{max}|}\right) \tag{5}$$

Where $I_{min}$ is a minimum memory cell current, $\Delta I_{max}$ is a dynamic range of the memory cell currents, which is scaled by weight w normalized to the absolute value of the maximum weight in a layer, $|W_{max}|$. Thus, in an embodiment each memory cell 908 in layer 916 is programmed to conduct a corresponding $I_{cell\text{-}xy}$ current determined from weights $w_{11}, w_{21}, w_{31}, \ldots, w_{mn}$ as specified by Equation (5).

Persons of ordinary skill in the art will understand that VMM circuit 900 alternatively may be implemented using differential circuitry by mapping each weight $w_{11}$, $w_{21}$, $w_{31}, \ldots, w_{mn}$ to two memory cells, one of which conducts a first current $I_{cell\text{-}xy}+$, the other of which conducts a second current $I_{cell\text{-}xy}-$, given by the following formulas:

$$I_{cell-xy} += I_{min} + \Delta I_{max}\left(\frac{|w_{xy}| + w_{xy}}{2|W_{max}|}\right) \tag{6a}$$

$$I_{cell-xy} -= I_{min} + \Delta I_{max}\left(\frac{|w_{xy}| + w_{xy}}{2|W_{max}|}\right) \tag{6b}$$

In such a differential implementation, each NAND string $\mathbf{904}_{xy}$ would be implemented using two separate NAND strings, one providing first current $I_{cell\text{-}xy}+$ to a first bit line (e.g., $BL_1+$) and the other providing second current $I_{cell\text{-}xy}-$ to a second bit line (e.g., $BL_1-$).

In an embodiment, an input neuron circuit 918 provides elements $x_1, x_2, x_3, \ldots, x_m$ of an input vector X to drain side select lines $\mathbf{912}_1$, $\mathbf{912}_2$, $\mathbf{912}_3, \ldots, \mathbf{912}_m$, respectively. In an embodiment, elements $x_1, x_2, x_3, \ldots, x_m$ of input vector X have binary values (e.g., 0 (LOW) and 1 (HIGH).

Thus, if an element $x_j$=0 (LOW), the corresponding drain side select lines 912*j* is LOW, drain side select transistors 906 of NAND strings $\mathbf{904}_{j1}$, $\mathbf{904}_{j2}$, $\mathbf{904}_{j3}, \ldots, \mathbf{904}_{jn}$ are OFF, and those NAND strings do not provide any programmed memory cell currents $I_{cell\text{-}xy}$ to bit lines $BL_1$, $BL_2$, $BL_3$, . . . , $BL_n$.

In contrast, if an element $x_j$=1 (HIGH), the corresponding drain side select lines 912*j* is HIGH, drain side select transistors 906 of NAND strings $\mathbf{904}_{j1}$, $\mathbf{904}_{j2}$, $\mathbf{904}_{j3}$, . . . , $\mathbf{904}_{jn}$ are ON, and those NAND strings provide the programmed memory cell currents $I_{cell\text{-}xy}$ to bit lines $BL_1$, $BL_2$, $BL_3$, . . . , $BL_n$.

In an embodiment, NAND strings $\mathbf{904}_{xy}$ at the same y-location are coupled to a corresponding bit line $BL_y$. Thus, for example, NAND strings $\mathbf{904}_{11}$, $\mathbf{904}_{21}$, $\mathbf{904}_{31}$, . . . , $\mathbf{904}_{m1}$ are all coupled to bit line $BL_1$, NAND strings $\mathbf{904}_{12}$, $\mathbf{904}_{22}$, $\mathbf{904}_{32}$, . . . , $\mathbf{904}_{m2}$ are all coupled to bit line $BL_2$, and so on.

In an embodiment, a controller 920 is connected to an output sensing circuit 922. In an embodiment, output sensing circuit 922 includes n sense amplifier circuits, each coupled to a corresponding one of bit lines $BL_1$, $BL_2$, $BL_3$, . . . , $BL_n$ of NAND array 902. In an embodiment, each sense amplifier circuit senses the current in a corresponding bit line $BL_1$, $BL_2$, $BL_3$, . . . , $BL_n$. Persons of ordinary skill in the art will understand that in a differential circuit implementation, each sense amplifier circuit senses the current in a corresponding pair of bit lines (e.g., $BL_1$+ and $BL_1$−).

In an embodiment, each sense amplifier circuit of output sensing circuit 922 senses the current in a corresponding bit line $BL_1$, $BL_2$, $BL_3$, . . . , $BL_n$ through multiple integration and rescaling cycles calculates the elements $y_1$, $y_2$, $y_3$, . . . , $y_n$ of output vector Y. For example, if input vector X has p-bit resolution, each sense amplifier in sensing circuit 922 includes a capacitor that integrates the programmed memory cell currents $I_{cell\text{-}xy}$ during p integration and rescaling cycles, and then converts a generated voltage pulse to a pulse duration, which is then converted to binary data.

Figure 9D:
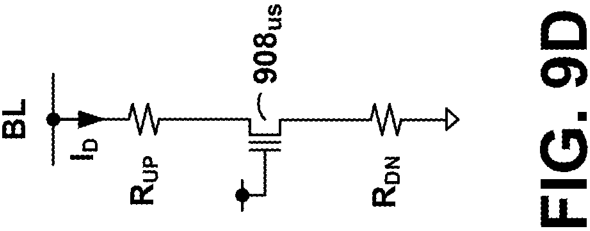
FIG. 9D depicts a simplified equivalent model of the NAND string of FIG. 9B.
Figure 9C:
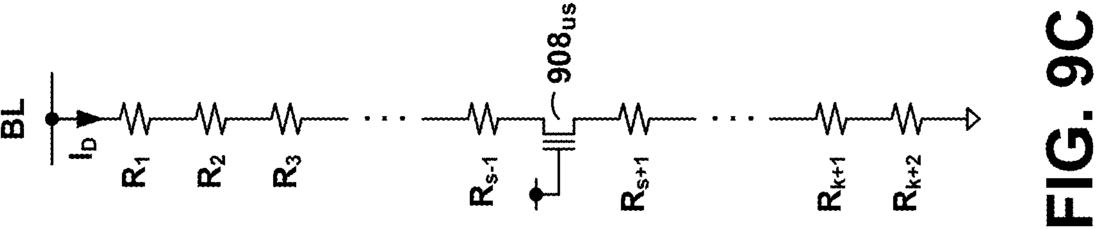
FIG. 9C depicts an equivalent model of the NAND string of FIG. 9B.
Figure 9B:
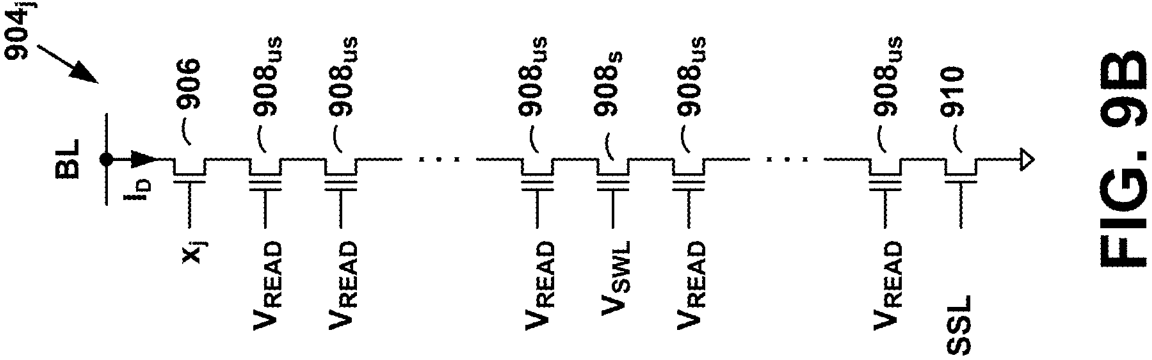
FIG. 9B is a simplified diagram of a single NAND string of the 3D NAND cross-point memory structure of FIG. 9A.

FIG. 9B is a simplified diagram of a single NAND string 904*j* of NAND array 902, and depicts an element $x_j$ of input vector X coupled to a control gate of drain side select transistor 906, read pass voltages $V_{READ}$ coupled to control gates of unselected memory cells $\mathbf{908}_{us}$, selected word line voltage $V_{SWL}$ coupled to a control gate of selected memory cell $\mathbf{908}_s$, and source side select line SSL is coupled to a control gate of source side select transistor 910.

When example NAND string $\mathbf{904}_j$ is used for VMM, selected memory cell $\mathbf{908}_s$ operates as a transistor, whereas drain side select transistor 906, unselected memory cells $\mathbf{908}_{us}$, and source side select transistor 910 are each biased in their ohmic region, and operate as resistors. Thus, FIG. 9C depicts an equivalent circuit of NAND string $\mathbf{904}_j$ of FIG. 9B, with unselected memory cells $\mathbf{908}_{us}$ represented as resistors $R_1$, $R_2$, . . . , $R_k$. In an embodiment, NAND string $\mathbf{904}_j$ conducts a current $I_D$, which is substantially equal to the programmed current of selected memory cell $\mathbf{908}_s$, as specified by Equation (5).

FIG. 9C can be further simplified as shown in FIG. 9D, which consolidates all of the series connected resistors above selected memory cell $\mathbf{908}_s$ as a single resistor $R_{UP}$, and consolidates all of the series connected resistors below selected memory cell $\mathbf{908}_s$ as a single resistor $R_{DN}$. The output resistance $R_{os}$ of a single NAND string (as seen from the bit line BL) can be expressed as:

$$R_{os} = R_{UP} + r_o + R_{DN}(1 + g_m r_o) \tag{7}$$

where $r_o$ and $g_m$ are the output resistance and transconductance, respectively, of selected memory cell $\mathbf{908}_s$.

Referring again to FIG. 9A, each of bit lines $BL_1$, $BL_2$, $BL_3$, . . . , $BL_n$ of NAND array 902 is coupled to m NAND strings $\mathbf{904}_{xy}$. Thus, from the perspective of a sense amplifier circuit in output sensing circuit 922, the output resistance $R_{out}$ of the m parallel-connected NAND strings $\mathbf{904}_{xy}$ of NAND array 902 is approximately equal to:

$$R_{out} \approx \frac{R_{os}}{m} \tag{8}$$

Figure 9E:
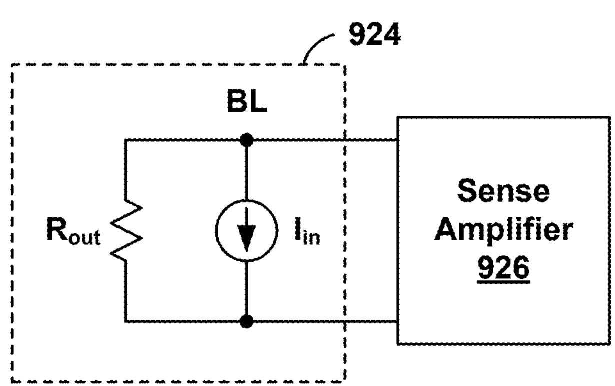
FIG. 9E depicts a model of the parallel-connected NAND strings coupled to a sense amplifier of an output sensing circuit.

FIG. 9E thus depicts a simplified equivalent circuit 924 of the m parallel-connected NAND strings $\mathbf{904}_{xy}$ coupled to a sense amplifier 926 of output sensing circuit 922. Circuit 924 will be referred to herein as NAND array circuit 924, and includes a resistor $R_{out}$ in parallel with a current source $I_{in}$, where $I_{in}$ is the sum of memory cell currents $I_{cell\text{-}xy}$ of the m NAND strings $\mathbf{904}_{xy}$ coupled to a bit line BL.

Figure 9F:
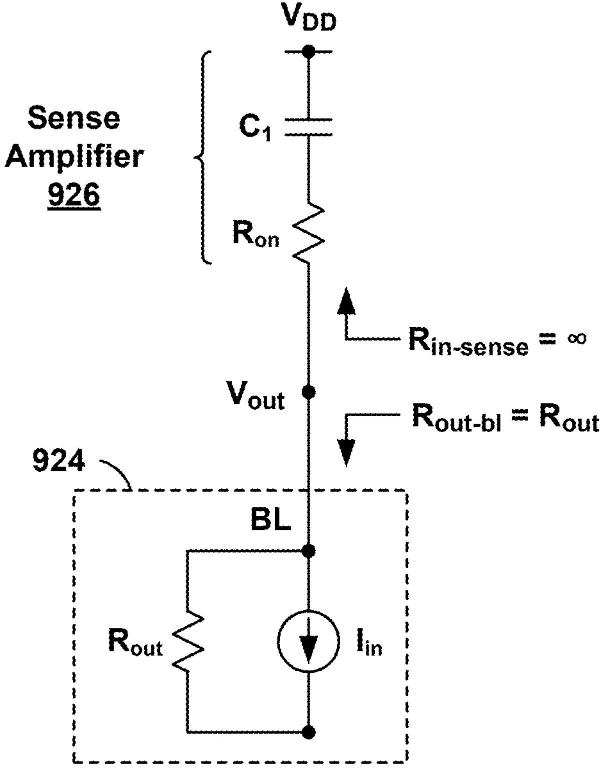
FIG. 9F depicts a model of parallel-connected NAND strings coupled to a sense amplifier during an integration cycle.

As described above, each sense amplifier 926 in sensing circuit 922 includes a capacitor that integrates the programmed memory cell currents $I_{cell\text{-}xy}$ of the m NAND strings $\mathbf{904}_{xy}$ during integration cycles. FIG. 9F depicts NAND array circuit 924 coupled at interface node $V_{out}$ to a sense amplifier 926 during an integration cycle. In particular, sense amplifier 926 is modeled as a capacitor $C_1$ in series with a resistor $R_{on}$, where $C_1$ is the integration capacitor of sense amplifier 926 and $R_{on}$ is an on-resistance of a switch that connects integration capacitor $C_1$ to bit line BL. Interface node is also referred to herein as the "array-to-neuron interface." As indicated in FIG. 9F, the DC input resistance $R_{in\text{-}sense}$ of sense amplifier 926 as seen from interface node $V_{out}$ is infinite, and the DC output resistance $R_{out\text{-}bl}$ of NAND array circuit 924 is output resistance $R_{out}$.

In an ideal current sensing circuit coupled to a device under test, the sensing circuit (such as sense amplifier 926) has a DC input resistance $R_{in\text{-}sense}$ equal to 0, or the device under test (such as NAND array circuit 924) has an infinite output resistance $R_{out\text{-}bl}$. Satisfying either of these conditions ensures accurate current sensing because $R_{in\text{-}sense}$=0 guarantees that the input impedance of sense amplifier 926 does not load NAND array circuit 924, and $R_{out\text{-}bl}$=∞ guarantees no change in memory cell currents $l_{in}$ even if there is loading due to a nonzero $R_{in\text{-}sense}$.

As indicated in FIG. 9F, however, sense amplifier 926 has a non-zero input resistance, and NAND array circuit 924 has a finite DC output resistance. As a result, sensing circuit 922 directly and linearly loads NAND array circuit 924, and the finite output resistance of NAND array circuit 924 results in noticeable sensing error, distortion and precision reduction in VMM circuit 900.

The error induced due to the nonideal impedance matching can be controlled by limiting the voltage swing $V_{swing}$ on the interface node $V_{out}$. More specifically, the output sensing circuit design typically starts with distortion requirements, which limits voltage swing $V_{swing}$ on, and SNR requirements, which limits the integration time $T_p$. In addition, $\Delta I_{max}$ (dynamic range of the memory cell currents) is process and network dependent (input and weight distributions) and hence can not be adjusted. As a result, the size of integration capacitor $C_1$ is given by:

$$C_1 = DI_{max}\frac{T_p}{V_{swing}} \tag{9}$$

The area/distortion trade-off is explicit in Equation (9), as it is desirable to reduce the size of integration capacitor $C_1$ by maximizing $V_{swing}$. However, due to the nonideal impedance matching conditions at interface node $V_{out}$, the larger the $V_{swing}$, the larger the distortion.

Technology is described to modify the impedance matching conditions at the array-to-neuron interface of VMM circuit 900. In particular, technology is described to decrease the DC input resistance $R_{in\text{-}sense}$ of sense amplifier 926, and increase the DC output resistance $R_{out}$ of NAND array circuit 924. Without wanting to be bound by any particular theory, it is believed that modifying the impedance matching conditions on the array-to-neuron interface may reduce sensing error and distortion, and precision reduction in VMM circuit 900.

Figure 10A:
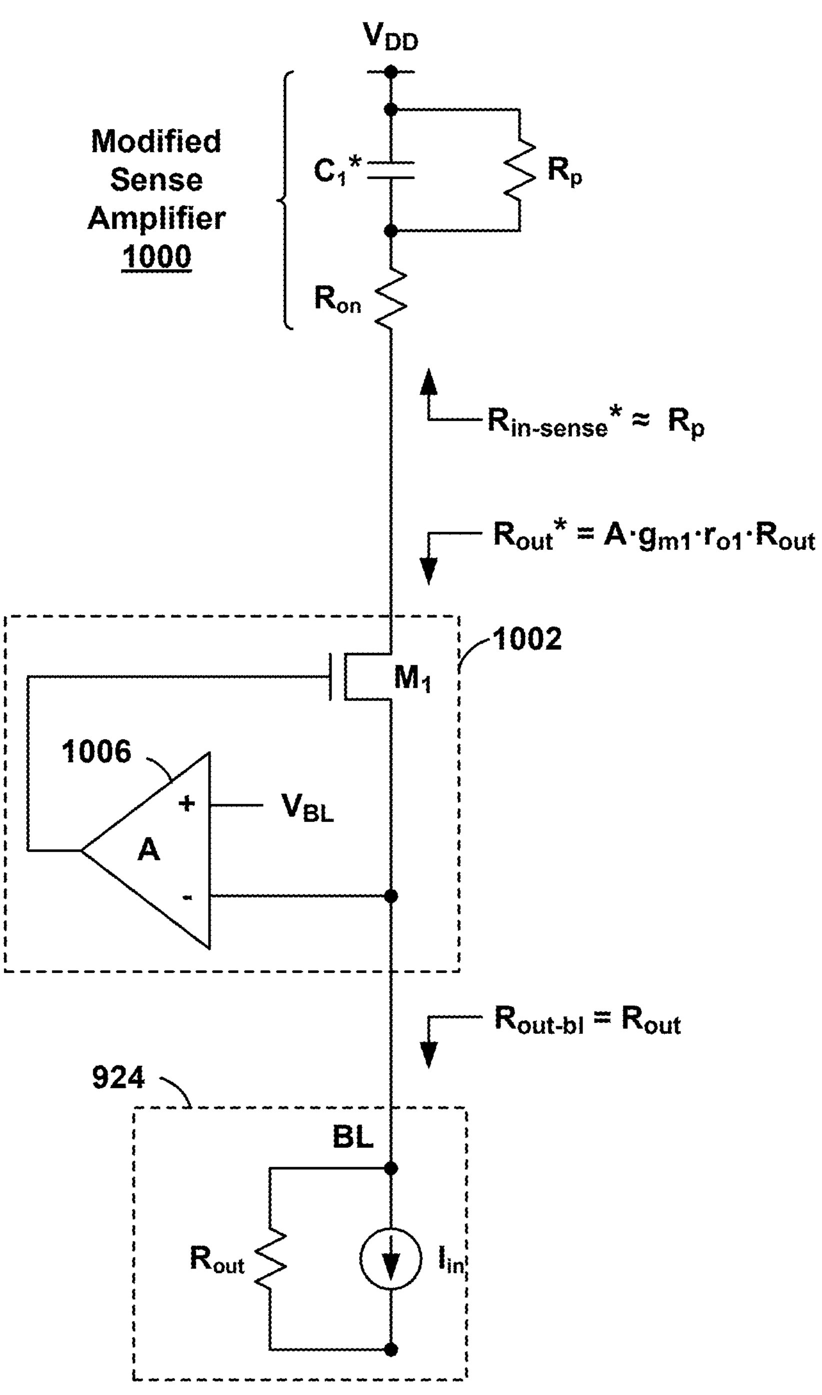
FIG. 10A is a simplified circuit diagram of a modified sense amplifier coupled via an impedance translator circuit to a model of parallel-connected NAND strings.

FIG. 10A is a simplified circuit diagram of a modified sense amplifier 1000 coupled via an impedance translator circuit 1002 at bit line BL to NAND array circuit 924. In an embodiment, modified sense amplifier 1000 is similar to sense amplifier 926, but includes a resistive circuit element $R_p$ coupled in parallel with a capacitor $C_1$*. In an embodiment, resistive circuit element $R_p$ can be implemented as an actual resistor having a resistance $R_p$. As described in more detail below, in other embodiments resistive circuit element $R_p$ can be implemented using one or more transistors.

The effect of including resistive circuit element $R_p$ is the addition of a zero at $1/(C_1{}^*R_p)$, which reduces the DC resistance of modified sense amplifier 1000. Indeed, input impedance $R_{in\text{-}sense}$ of modified sense amplifier 1000 is approximately equal to $R_p$. Thus, inclusion of resistive circuit element $R_p$ reduces the input impedance from $\infty$ to $R_p$.

Valid values of $R_p$ can be determined based on the following analysis. In the conventional sense amplifier 926, the voltage swing across capacitor $C_1$ at the $p^{th}$ integration cycle is given by the following equation:

$$\Delta V_{C_1(p)} \frac{T_p}{C_1} \sum_{i=1}^{m} I_{cell-xy} x_i(p) \tag{10}$$

where $T_p$ is the integration period, $C_1$ is the integration capacitor, $x_i(0)$ is the $i^{th}$ binary input vector element, m is the input vector size and $I_{cell\text{-}xy}$ is the cell current of the $i^{th}$ memory cell.

In contrast, for modified sense amplifier 1000 the voltage swing across capacitor $C_1$* at the $p^{th}$ integration cycle is given by the following equation:

$$\Delta V_{C_1}(p) = R_p\left(1 - e^{-\frac{T_p}{R_p C_1^*}}\right) \sum_{i=1}^{m} I_{cell-xy} x_i(p) \tag{11}$$

Comparing Equations (10) and (11), the sense amplifier's transconductance has changed from $$\frac{T_p}{C_1} \text{ to } \left(1 - e^{-\frac{T_p}{R_p C_1^*}}\right).$$

For the same integration time $T_P$, the voltage swing across capacitor $C_1$* will be the same as the voltage swing across capacitor $C_1$ if:

$$\frac{T_p}{C_1} = R_p\left(1 - e^{-\frac{T_p}{R_p C_1^*}}\right) \tag{12}$$

Solving Equation (12) for $C_1$*:

$$C_1^* = \frac{T_p}{R_p} ln\left(\frac{1}{1 - \frac{T_p}{R_p C_1}}\right) \tag{13}$$

A valid value of $C_1$* can be obtained when $$R_p > \frac{T_p}{C_1}.$$

Assuming that $$R_p = K\frac{T_p}{C_1},$$

where K is a constant scale factor (e.g., K=2), and solving for $C_1$*:

$$C_1^* = \frac{C_1}{K\, ln\left(\frac{K}{K-1}\right)} \tag{14}$$

Which means that the same voltage swing can be obtained in modified sense amplifier 1000 using a capacitor $C_1$* that is smaller than capacitor $C_1$ of sense amplifier 926 by a factor of K ln $$\left(\frac{K}{K-1}\right).$$

Thus, as described above, if integration time $T_P$ and voltage swing are kept the same as that of sense amplifier 926, the values for $R_p$ and $C_1$* are determined from:

$$R_p = K\frac{T_p}{C_1} \tag{15}$$

$$C_1^* = \frac{C_1}{K\, ln\left(\frac{K}{K-1}\right)} \tag{16}$$

Alternatively, if only integration time $T_P$ is kept the same as that of sense amplifier 926, a range of valid values for $R_p$ and $C_1$* can be determined by solving:

$$\frac{T_p}{C_1} > R_p\left(1 - e^{-\frac{T_p}{R_p C_1^*}}\right) \tag{17}$$

Without wanting to be bound by any particular theory, it is believed that an advantage of this technique may be a reduction of capacitance size at the same swing $V_{swing}$. Without wanting to be bound by any particular theory, it is believed that another advantage of this technique is that by keeping the same capacitor size, swing $V_{swing}$ can be reduced.

Figure 10B:
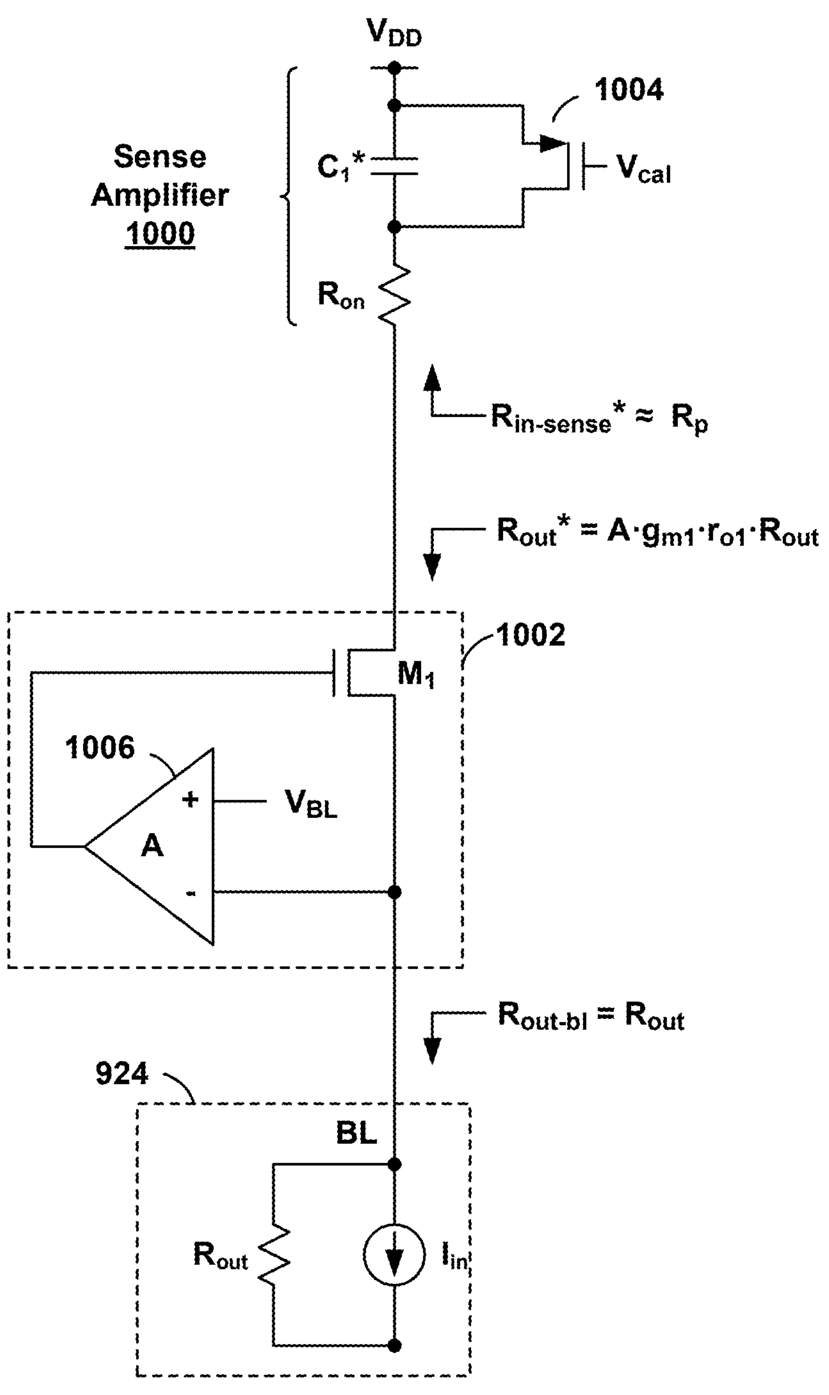
FIG. 10B is a simplified diagram of an alternative circuit of FIG. 10A.

As described above, resistive circuit element $R_p$ can be implemented using an actual resistor. FIG. 10B depicts an alternative embodiment of the model of FIG. 10A, with resistive circuit element $R_p$ implemented using a transistor 1004 (e.g., a PMOS transistor or a pass-gate style pair of PMOS/NMOS transistors). In an embodiment, a control terminal (e.g., a gate) of transistor 1004 is coupled to a bias voltage $V_{cal}$, which is calibrated to bias transistor 1004 in an ohmic region, with an equivalent resistance $R_p$.

Referring again to FIG. 10A, in an embodiment impedance translator circuit 1002 increases the effective DC output resistance $R_{out}$* (a first output resistance) of NAND array circuit 924. In an embodiment, impedance translator circuit 1002 includes a transistor M1 and an amplifier 1006. In an embodiment, transistor M1 is implemented in a cascode configuration (sometimes referred to as "$g_m$-boosting"). The effective DC output resistance $R_{out}$* (a second output resistance) of NAND array circuit 924 is equal to:

$$R^*_{out} = (A \cdot g_{m1} \cdot r_{o1}) \times R_{out} \tag{18}$$

where A is the gain of amplifier 1006, $g_{m1}$ is the transconductance of transistor M1, $r_{o1}$ is the output resistance of transistor M1, and $R_{out}$ is the output resistance $R_{out-bl}$ of NAND array circuit 924. Thus, by including impedance translator circuit 1002, the DC output resistance of NAND array circuit 924 as seen by modified sense amplifier 1000 is increased (or amplified) from $R_{out}$ to $(A \cdot g_{m1} \cdot r_{o1}) \times R_{out}$. The amplification factor is $(A \cdot g_{m1} \cdot r_{o1})$.

Without wanting to be bound by any particular theory, it is believed that impedance translator circuit 1002 modulates the DC resistance $R_{out}$ of NAND array circuit 924 coupled to modified sense amplifier 1000. Without wanting to be bound by any particular theory, it is believed that translator circuit 1002 may reduce sensing error, distortion and precision reduction in VMM circuit 900.

Persons of ordinary skill in the art will understand that the gate of transistor M1 alternatively may be coupled to a fixed bias voltage instead of using amplifier 1006, and that in such an embodiment the effective DC output resistance of NAND array circuit 924 $R_{out}$* of NAND array circuit 924 would be $R_{out}^* = (g_{m1} \cdot r_{o1}) \times R_{out}$. Thus, the amplification factor $(g_{m1} \cdot r_{o1})$ is less than that of the embodiment that includes amplifier 1006, but this alternative embodiment eliminates the need for extra DC current consumption through transistor M1.

Figure 10C:
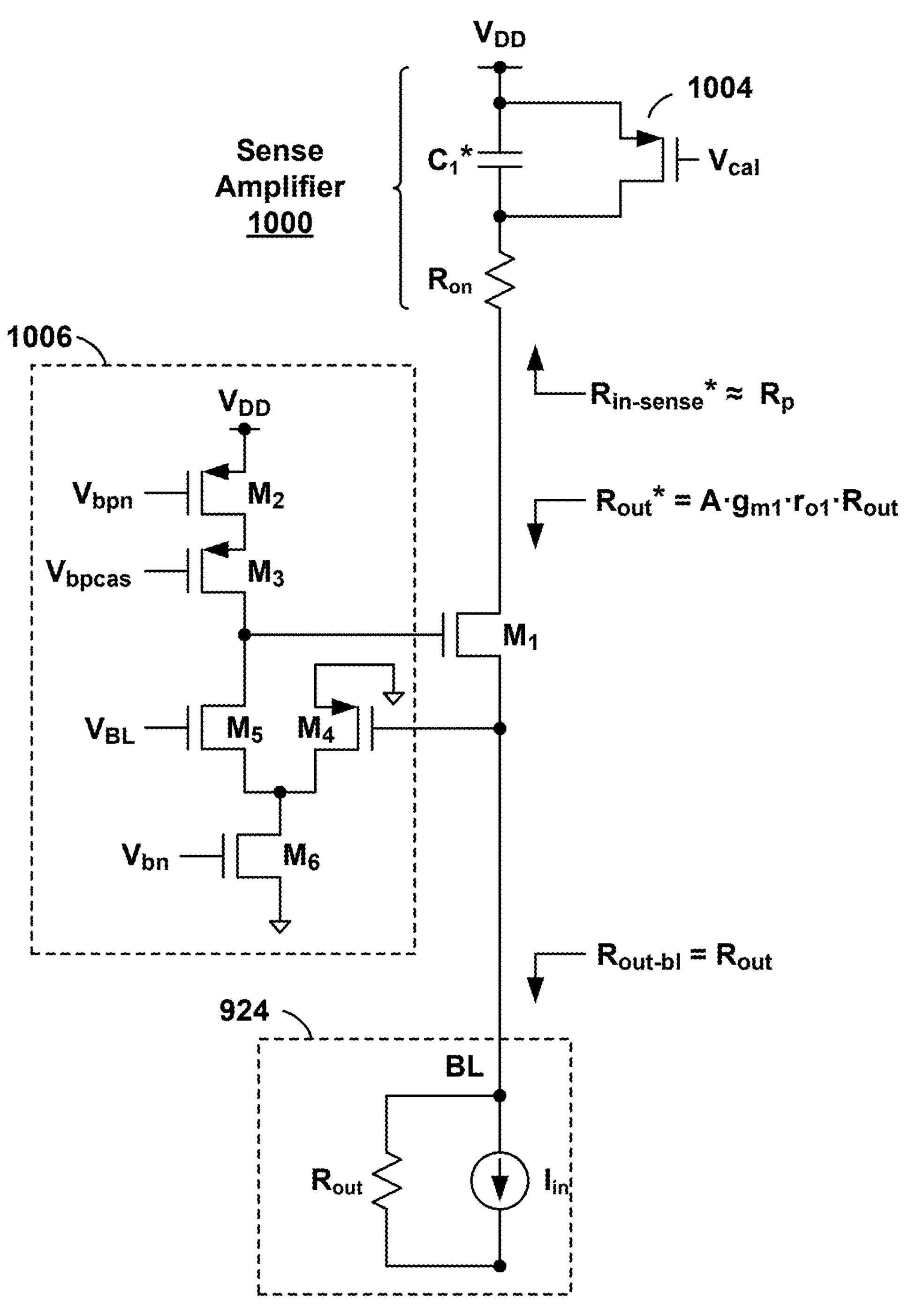
FIG. 10C is a simplified diagram of another alternative circuit of FIG. 10A.

FIG. 10C depicts the model of FIG. 10A, with an embodiment of amplifier 1006. In particular, amplifier 1006 includes p-channel transistors M2, M3 and M4, and n-channel transistors M5 and M6 configured as a conventional differential pair amplifier. Bias voltages $V_{bpn}$, $V_{bpcas}$, $V_{BL}$, and $V_{bn}$ can be generated by a biasing circuit (not shown). Amplifier 1006 has a gain $A \approx g_{m3} r_{o3}$, where $g_{m3}$ and $r_{o3}$ are the transconductance and output resistance, respectively, of transistor M3. Thus, from Equation (18), above, the effective DC output resistance $R_{out}$* of NAND array circuit 924 can be written as:

$$R^*_{out} = (g_{m1} \cdot r_{o1} \cdot g_{m3} \cdot r_{o3}) \times R_{out} \tag{19}$$

Figure 10D:
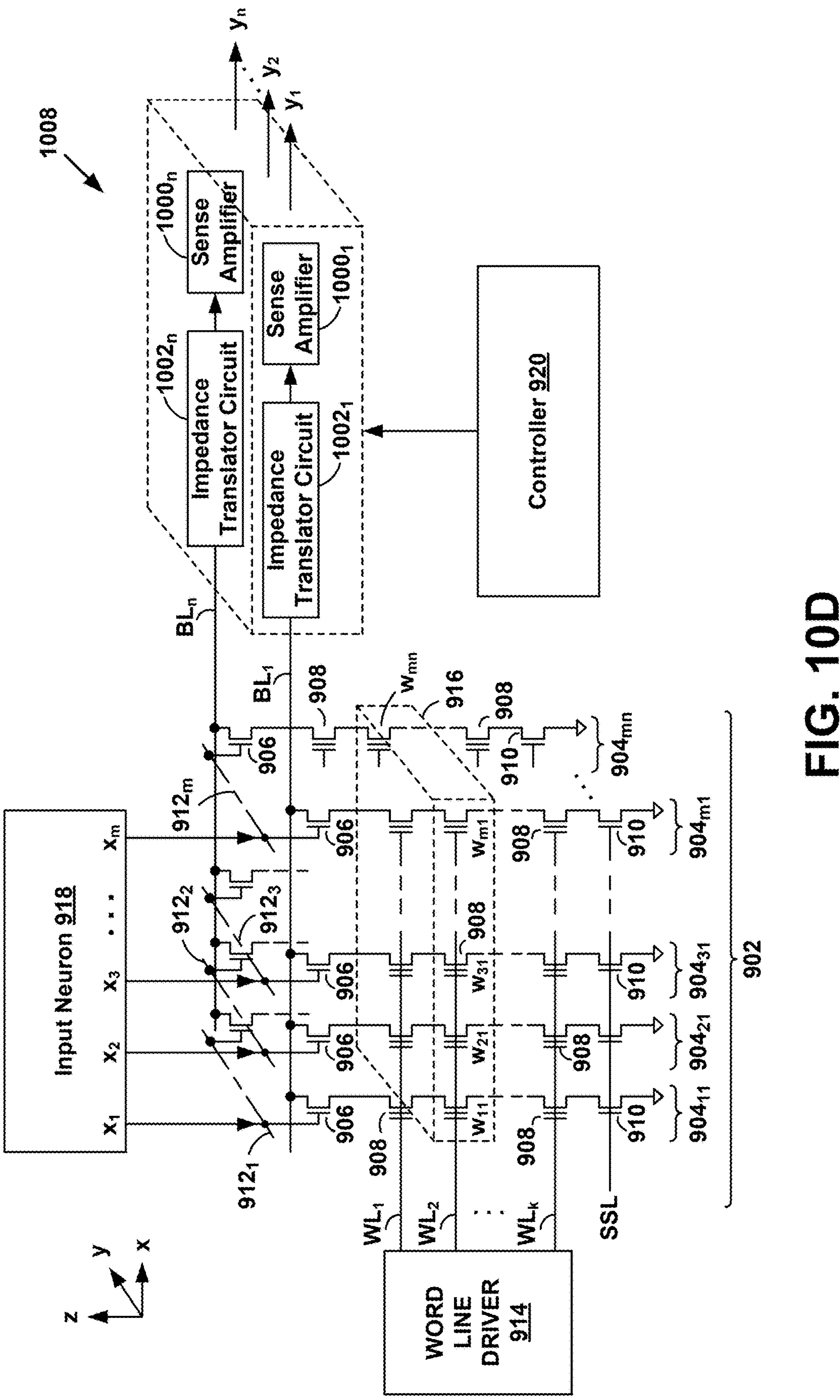
FIG. 10D depicts another example time-based vector-matrix multiplication circuit implemented using a 3D NAND cross-point memory structure.

FIG. 10D depicts an example time-based VMM circuit 1008 implemented using a 3D NAND cross-point memory structure. Time-based VMM circuit 1008 is similar to time-based VMM circuit 900 of FIG. 9A, but includes impedance translator circuits 1002$_1$, . . . , 1002$_n$ each disposed between corresponding bit lines $BL_1$, . . . , $BL_n$, respectively, and modified sense amplifiers 1000$_1$, . . . , 1000$_n$, respectively.

Figure 11:
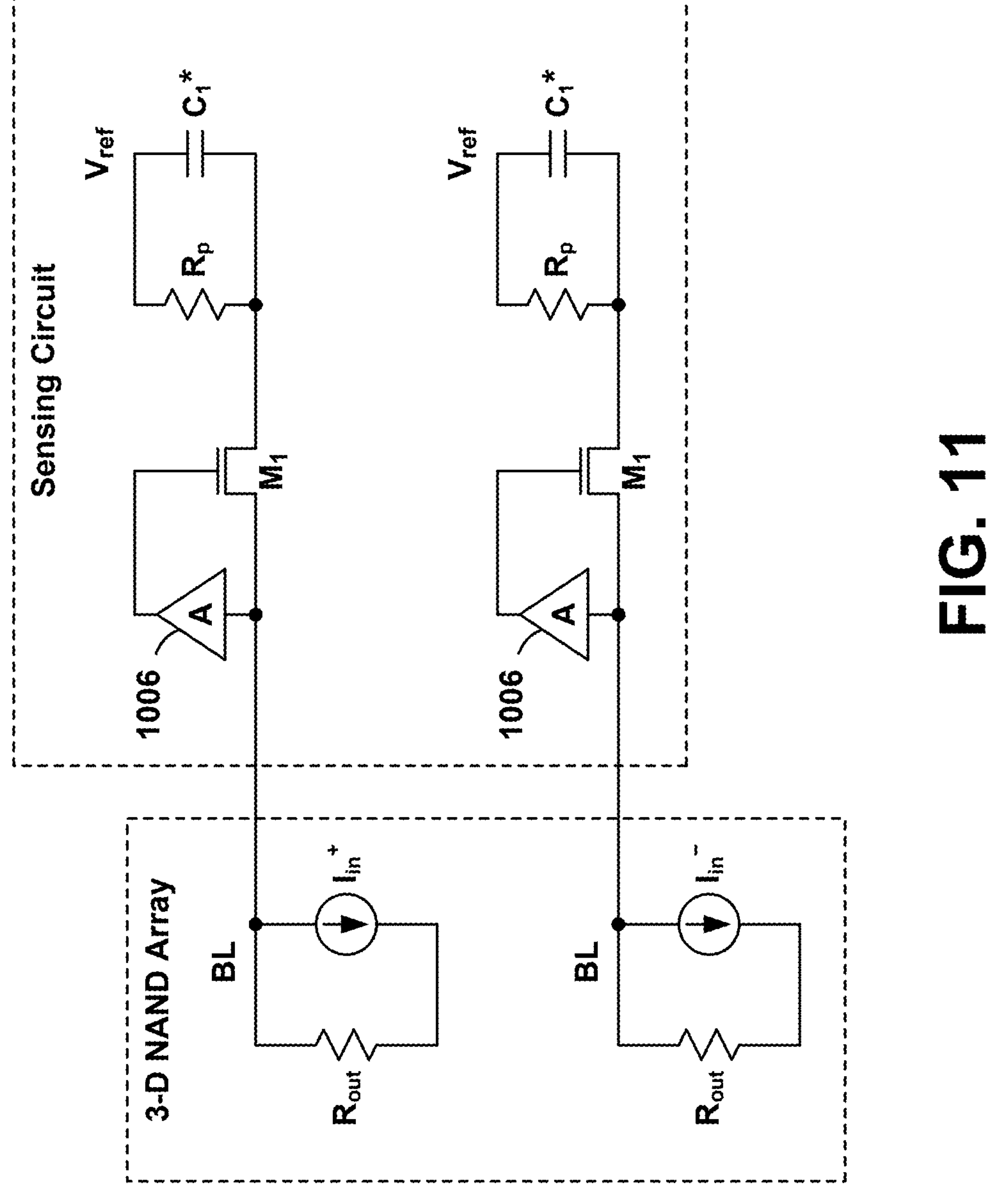
FIG. 11 is a simplified circuit diagram of a differential implementation of the 3D NAND array of FIG. 9A coupled to a differential implementation of the output sensing circuit of FIG. 9A.

FIG. 11 is a diagram of a simplified circuit of a differential implementation of NAND array circuit 924 coupled to a differential implementation of output sensing circuit 922. Differential current $I_{in}^+$ is the sum of memory cell currents $I_{cell-xy}$+ described above in Equation (6a), and $I_{in}^-$ is the sum of memory cell currents $I_{cell-xy}$− described above in Equation (6b).

Figure 12:
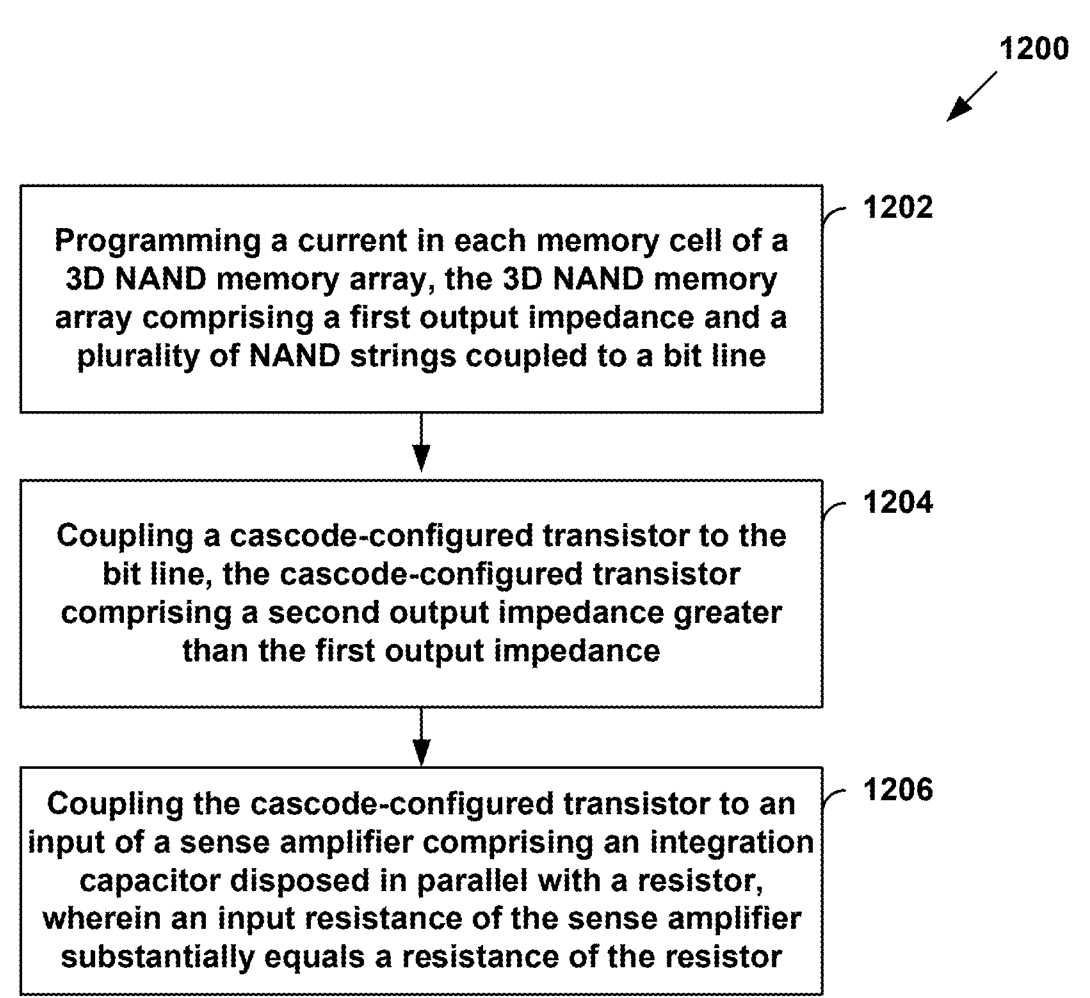
FIG. 12 is a flow diagram of a method for performing a time-based vector-matrix multiplication.

FIG. 12 is a flow diagram of an embodiment of a process 1200 for performing a time-based vector-matrix multiplication. In an example embodiment, process 1200 is performed on memory die 106 (FIG. 1), memory die 200 (FIG. 2A), or control die 240 (FIG. 2B) using the control circuits discussed above. For example, process 1200 can be performed at the direction of state machine 228 (FIGS. 2A-2B).

At step 1202, programming a current in each memory cell of a 3D NAND memory array, the 3D NAND memory array comprising a first output impedance and a plurality of NAND strings coupled to a bit line;

At step 1204, coupling a cascode-configured transistor to the bit line, the cascode-configured transistor comprising a second output impedance greater than the first output impedance; and At step 1206, coupling the cascode-configured transistor to an input of a sense amplifier comprising an integration capacitor disposed in parallel with a resistor. An input resistance of the sense amplifier substantially equals a resistance of the resistor.

In an embodiment, an apparatus is provided that includes a memory array including non-volatile memory cells configured to store weights of an artificial neural network, a bit line coupled to a plurality of the non-volatile memory cells, and an interface circuit coupled to the bit line, the interface circuit configured to amplify an output impedance of the memory array.

In an embodiment, an apparatus is provided that includes an array of vertical NAND strings, each comprising a plurality of non-volatile memory cells, each non-volatile memory cell configured to conduct a current based on a corresponding weight of a neuromorphic computing system, a plurality of bit lines, each coupled to a corresponding plurality of the vertical NAND strings, and a plurality of sense amplifiers, each coupled to a corresponding bit line. Each sense amplifier includes a capacitor configured to integrate a current conducted by the corresponding bit line, and a resistive circuit element configured to reduce an input impedance of the sense amplifier.

In an embodiment, an method is provided that includes performing a time-based vector-matrix multiplication by programming a current in each memory cell of a 3D NAND memory array, the 3D NAND memory array comprising a first output impedance and a plurality of NAND strings coupled to a bit line, coupling a cascode-configured transistor to the bit line, the cascode-configured transistor comprising a second output impedance greater than the first output impedance, and coupling the cascode-configured transistor to an input of a sense amplifier comprising an integration capacitor disposed in parallel with a resistor. An input resistance of the sense amplifier substantially equals a resistance of the resistor.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
- a memory array comprising non-volatile memory cells configured to store weights of an artificial neural network;
- a bit line coupled to a plurality of the non-volatile memory cells; and
- an interface circuit coupled to the bit line, the interface circuit configured to amplify an output impedance of the memory array.

2. The apparatus of claim 1, wherein an output impedance of the interface circuit is greater than an output impedance of the memory array.

3. The apparatus of claim 1, wherein an output impedance of the interface circuit substantially equals a multiple of the output impedance of the memory array.

4. The apparatus of claim 1, wherein the interface circuit comprises a transistor comprising a cascode configuration.

5. The apparatus of claim 1, wherein the interface circuit comprises an amplifier.

6. The apparatus of claim 5, wherein the interface circuit comprises:
- an amplifier comprising an input terminal coupled to the bit line; and
- a transistor comprising a source terminal coupled to the bit line, and a gate terminal coupled to an output terminal of the amplifier.

7. The apparatus of claim 1, further comprising a sense amplifier coupled to the interface circuit.

8. The apparatus of claim 7, wherein the sense amplifier comprises a capacitor configured to integrate a current from the bit line.

9. The apparatus of claim 7, wherein the sense amplifier comprises a resistive circuit element configured to reduce an input impedance of the sense amplifier.

10. The apparatus of claim 7, wherein the sense amplifier comprises a capacitor and a resistive circuit element disposed in parallel with the capacitor.

11. The apparatus of claim 7, wherein the sense amplifier comprises a capacitor and a transistor disposed in parallel with the capacitor, the transistor biased to operate in an ohmic region.

12. The apparatus of claim 1, wherein the memory array is configured to perform vector matrix multiplication.

13. The apparatus of claim 1, wherein the memory array comprises a plurality of 3D NAND memory strings coupled to the bit line.

14. The apparatus of claim 1, comprising a time-based vector-matrix multiplication circuit.

15. An apparatus comprising
- an array of vertical NAND strings, each comprising a plurality of non-volatile memory cells, each non-volatile memory cell configured to conduct a current based on a corresponding weight of a neuromorphic computing system;
- a plurality of bit lines, each coupled to a corresponding plurality of the vertical NAND strings; and
- a plurality of sense amplifiers, each coupled to a corresponding bit line, wherein each sense amplifier comprises:
- a capacitor configured to integrate a current conducted by the corresponding bit line; and
- a resistive circuit element configured to reduce an input impedance of the sense amplifier.

16. The apparatus of claim 15, wherein the resistive circuit element comprises a resistor disposed in parallel with the capacitor.

17. The apparatus of claim 15, wherein the resistive circuit element comprises a transistor disposed in parallel with the capacitor.

18. The apparatus of claim 15, wherein each sense amplifier comprises an input impedance substantially equal to a resistance of the resistive circuit element.

19. The apparatus of claim 15, comprising a time-based vector-matrix multiplication circuit.

20. A method comprising:

performing a time-based vector-matrix multiplication by:
- programming a current in each memory cell of a 3D NAND memory array, the 3D NAND memory array comprising a first output impedance and a plurality of NAND strings coupled to a bit line;
- coupling a cascode-configured transistor to the bit line, the cascode-configured transistor comprising a second output impedance greater than the first output impedance; and coupling the cascode-configured transistor to an input of a sense amplifier comprising an integration capacitor disposed in parallel with a resistor, wherein an input resistance of the sense amplifier substantially equals a resistance of the resistor.

* * * * *